(12) United States Patent
Ogata et al.

(10) Patent No.: US 9,024,936 B2
(45) Date of Patent: May 5, 2015

(54) IMAGE DISPLAY DEVICE, PANEL AND PANEL MANUFACTURING METHOD

(75) Inventors: Hidenori Ogata, Osaka (JP); Yuhki Kobayashi, Osaka (JP); Makoto Yamada, Osaka (JP); Ken Okamoto, Osaka (JP); Yoshimasa Fujita, Osaka (JP); Katsumi Kondoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 372 days.

(21) Appl. No.: 13/512,861

(22) PCT Filed: Dec. 2, 2010

(86) PCT No.: PCT/JP2010/071572
§ 371 (c)(1),
(2), (4) Date: Jul. 9, 2012

(87) PCT Pub. No.: WO2011/068158
PCT Pub. Date: Jun. 9, 2011

(65) Prior Publication Data
US 2012/0268445 A1   Oct. 25, 2012

(30) Foreign Application Priority Data

Dec. 3, 2009   (JP) .................................. 2009-275522

(51) Int. Cl.
*G09G 3/20* (2006.01)
*G09G 3/30* (2006.01)
(Continued)

(52) U.S. Cl.
CPC .......... *H01L 27/3293* (2013.01); *G09G 3/3225* (2013.01); *G09F 9/3026* (2013.01);
(Continued)

(58) Field of Classification Search
CPC .................... G09G 3/3225; G09G 2300/0426; G09G 2380/02; G09F 9/3026
USPC .................................................. 345/1.3, 903
See application file for complete search history.

(56) References Cited

U.S. PATENT DOCUMENTS 5,978,060 A * 11/1999 Nakawaki et al. ............ 349/150
6,228,228 B1 * 5/2001 Singh et al. ................. 204/192.1
(Continued)

FOREIGN PATENT DOCUMENTS

| JP | 2001-100652 A | 4/2001 |
|---|---|---|
| JP | 2002-297066 A | 10/2002 |

(Continued)

OTHER PUBLICATIONS

International Search Report received for PCT Patent Application No. PCT/JP2010/071572, mailed on Jan. 11, 2011, 5 pages (2 pages of English translation and 3 pages of PCT Search Report).
(Continued)

*Primary Examiner* — Michael J Eurice
(74) *Attorney, Agent, or Firm* — Morrison & Foerster LLP

(57) ABSTRACT

Provided are an image display device in which a desired number of panels are combined so that a large light-emitting surface is realized, a panel provided in the image display device, and a method for manufacturing the panel. For this purpose, a panel (11) of the present invention includes a rectangular light-emitting section (13); a substrate (12) having a flat surface (12a') on which the rectangular light-emitting section (13) is provided and a curved adjacent surface (12b') that is adjacent to one of edge portions of the flat surface which extend along long sides of the rectangular light-emitting section (13); and a terminal group that is drawn out from a long side of the rectangular light-emitting section (13) and that is disposed in the adjacent surface. The panels (11) are connected to each other by linking edge portions of the flat surfaces (12a') of the respective substrates (12) so that longitudinal directions of the respective rectangular display sections (13) are parallel to each other and so that the adjacent surface (12b') is located on the back side of the substrate (12). In an image display section, pixels (50) are arranged in a matrix, and sub-pixels in each of the pixels (50) are aligned in a column direction of the matrix.

18 Claims, 19 Drawing Sheets

(51) Int. Cl.
*H01L 27/32* (2006.01)
*G09G 3/32* (2006.01)
*G09F 9/302* (2006.01)
*H01L 51/00* (2006.01)
*H05B 33/08* (2006.01)

(52) U.S. Cl.
CPC .... *G09G2300/0426* (2013.01); *G09G 2380/02* (2013.01); *H01L 27/3211* (2013.01); *H01L 27/3288* (2013.01); *H01L 51/0096* (2013.01); *H05B 33/0896* (2013.01); *Y02E 10/549* (2013.01)

(56) References Cited

U.S. PATENT DOCUMENTS

| | | | | |
|---|---|---|---|---|
| 6,259,838 | B1* | 7/2001 | Singh et al. | 385/31 |
| 6,259,846 | B1* | 7/2001 | Roach et al. | 385/123 |
| 6,274,978 | B1* | 8/2001 | Roach et al. | 313/483 |
| 6,292,157 | B1* | 9/2001 | Greene et al. | 345/1.3 |
| 6,369,867 | B1* | 4/2002 | Ge | 349/73 |
| 6,496,238 | B1* | 12/2002 | Greene et al. | 349/73 |
| 6,642,542 | B1* | 11/2003 | Shimoda et al. | 257/59 |
| 6,667,783 | B2* | 12/2003 | Greene et al. | 349/73 |
| 6,693,684 | B2* | 2/2004 | Greene et al. | 349/73 |
| 2002/0036059 | A1* | 3/2002 | Kalt et al. | 156/267 |
| 2002/0051111 | A1* | 5/2002 | Greene et al. | 349/149 |
| 2002/0118321 | A1* | 8/2002 | Ge | 349/73 |
| 2002/0118525 | A1* | 8/2002 | Fritz et al. | 361/796 |
| 2002/0154076 | A1* | 10/2002 | Greene et al. | 345/87 |
| 2003/0090198 | A1* | 5/2003 | Aston | 313/498 |
| 2003/0184703 | A1* | 10/2003 | Greene et al. | 349/158 |
| 2004/0014252 | A1* | 1/2004 | Shimoda et al. | 438/22 |
| 2004/0051451 | A1* | 3/2004 | Kawase et al. | 313/512 |
| 2004/0051452 | A1* | 3/2004 | Tamashiro et al. | 313/512 |
| 2004/0080032 | A1* | 4/2004 | Kimura et al. | 257/678 |
| 2004/0189891 | A1* | 9/2004 | Hayashimoto et al. | 349/58 |
| 2004/0256977 | A1* | 12/2004 | Aston | 313/498 |
| 2006/0027804 | A1* | 2/2006 | Yamazaki et al. | 257/59 |
| 2006/0091794 | A1* | 5/2006 | Agostinelli et al. | 313/506 |
| 2007/0001927 | A1* | 1/2007 | Ricks et al. | 345/1.1 |
| 2009/0185127 | A1* | 7/2009 | Tanaka et al. | 349/152 |
| 2009/0279282 | A1* | 11/2009 | Iwamoto | 362/97.1 |
| 2010/0065832 | A1* | 3/2010 | Sugimoto | 257/40 |
| 2010/0156761 | A1* | 6/2010 | Veres et al. | 345/76 |

FOREIGN PATENT DOCUMENTS

| | | |
|---|---|---|
| JP | 2004-6724 A | 1/2004 |
| JP | 2004-111059 A | 4/2004 |
| JP | 2005-509904 A | 4/2005 |
| JP | 2005-123153 A | 5/2005 |
| WO | 2008/126250 A1 | 10/2008 |

OTHER PUBLICATIONS

Shim et al., "Simulation Study for Seamless Imaging of OLED Tiled Display", The 15th International Display Workshops (IDW), Dec. 3, 2008, vol. 1, pp. 173-176.

* cited by examiner

ORGANIC LAYER BECOMES THIN,
AND LEAKAGE OCCURS BETWEEN FIRST ELECTRODE AND SECOND ELECTRODE

IMAGE DISPLAY DEVICE, PANEL AND PANEL MANUFACTURING METHOD

CROSS REFERENCE TO RELATED APPLICATIONS

This is a U.S. National Phase patent application of PCT/JP2010/071572, filed Dec. 2, 2010, which claims priority to Japanese Patent Application No. 2009-275522, filed Dec 3, 2009, each of which is hereby incorporated by reference in the present disclosure in its entirety.

TECHNICAL FIELD

The present invention relates to an image display device, a panel, and a panel manufacturing method. More specifically, the present invention relates to an image display device in which a plurality of panels each having a display section on which organic electroluminescence (EL) elements are provided are combined so that a large-screen organic EL display can be realized.

BACKGROUND ART

In recent years, there are increasing needs for a flat panel display in accordance with advancement of a highly information-based society. Known as the flat panel display are a non-self-luminous liquid crystal display (LCD), a self-luminous plasma display (PDP), an inorganic electroluminescence (inorganic EL) display, an organic electroluminescence (organic EL) display, etc. Above all, advancement of organic EL displays is especially remarkable.

As for organic EL displays, a technique of displaying a moving image according to simple matrix driving and a technique of displaying a moving image according to active matrix driving of organic EL elements with the use of thin-film transistors (TFTs) are known.

In a conventional display, a pixel emitting red light, a pixel emitting a green light, and a pixel emitting a blue light are aligned as a single unit so as to create various colors represented by white. A full-color image is thus displayed.

In the case of organic EL display devices, this is achieved generally as follows. Specifically, red, green, and blue pixels are formed by creating a color pattern on an organic light emitting layer by a mask deposition method using a shadow mask. However, this method faces the challenges of mask processing accuracy, mask alignment accuracy, and an increase in mask size. Especially, in the field of large-sized displays represented by televisions, the substrate size is becoming larger and larger (from G6 to G8 and to G10). The conventional method requires a mask having a size equivalent to or larger than the substrate size, and therefore requires production and processing of a mask corresponding to a large-sized substrate. However, since a mask requires a very thin metal (general film thickness: 50 nm to 100 nm), it is very difficult to increase the mask size. As such, production and processing of a mask corresponding to a large-sized substrate become problems. The problems of mask processing accuracy and mask alignment accuracy lead to mixture of colors caused by mixture of light-emitting layers. In order to prevent this problem, it is generally necessary to increase a width of an insulating layer provided between pixels. This reduces the area of a light-emitting section in a case where the area of the pixels is fixed. This leads to a decline in aperture ratio of the pixels, thereby leading to a decline in luminance, an increase in power consumption, and a decline in lifetime. Further, according to a conventional production method, a deposition source is disposed below a substrate, and an organic layer is formed by depositing an organic material in an upward direction. This causes a problem of flexure in a central part of a mask as a result of an increase in substrate size (increase in mask size). The problem of flexure also causes the mixture of colors. In the extreme case, the organic layer is not formed in some regions. As a result, a defect occurs due to leakage between upper and lower electrodes. In addition, according to the conventional method, a mask deteriorates and becomes unusable after it is used specific times. Accordingly, the problems of an increase in mask size leads to an increase in cost of a display. Especially the cost problem is regarded as the biggest problem in an organic EL display.

In view of this, a method of producing a large-sized display by connecting a plurality of organic EL displays is proposed. However, in a case where a plurality of panels are connected, a seam is observed between the panels. This undesirably causes a decline in display quality. As a solution for this problem, Patent Literature 1 proposes a method of eliminating such a seam by sealing four panels from behind the panels at the sacrifice of an aperture ratio. Further, Non-Patent Literature 1 proposes a method of eliminating such a seam by disposing two panels so that sealing parts overlap each other and by bonding a transparent plate having an adjusted refractive index onto a substrate of one of the two panels.

CITATION LIST

Patent Literature 1

Japanese Patent Application Publication, Tokukai, No. 2004-111059 A (Publication Date: Apr. 8, 2004)

Non Patent Literature 1

The 15th International Display Workshops (held on Dec. 3 through Dec. 5, 2008)

SUMMARY OF INVENTION

Technical Problem

However, in a display, it is necessary to take out a terminal for driving a display section at least from two orthogonal sides out of four sides. Generally, an FPC (Flexible Printed Circuit) to be connected to a driving circuit need to be compression-bonded to these sides. It is therefore impossible to produce a seamless display by combining these sides. In Patent Literature 1, a single display is produced by combining four panels so that sides to which no FPC is connected are used to the fullest extent. In Non-Patent Literature 1, a single display is produced by combining two panels. However, none of these literatures mentions the biggest problem that arises in a case of producing a display by combining five or more units, i.e., how a middle unit is driven. Accordingly, in fact, at most four panels can be combined. Accordingly, it is necessary to increase the size of individual panels to be combined in order to produce a large-sized display. That is, the aforementioned production problems have not been completely solved yet.

Moreover, how display devices such as LCD and PDP are transported to general houses, how such display devices are carried into an installation place, and where such display devices are installed become problems as a result of an increase in size of such display devices. Similar problems occur also for conventional organic EL displays. These problems become more remarkable in a case where larger displays are introduced into general houses.

Further, in recent years, from the viewpoint of ecology, organic EL displays, which are very high in light emission efficiency, are attracting attentions also in the field of illumination.

Solution to Problem

The present invention was attained in view of the above problems, and an object of the present invention is to provide (i) an image display device constituted by a plurality of panels that are connected to each other, in which the number of panels to be combined (connected) is not limited, the seam problem is solved, a reduction in size is possible by reducing individual panels to be combined to a desired area even in the case of production of a large-sized panel, and a reduction in cost is possible, (ii) a panel provided in the image display device, and (iii) a method for producing the panel.

Another object of the present invention is to prevent an increase in cost of driving circuits that can result from use of the plurality of panels.

The inventors of the present invention studied the above various problems, and found that the above problems can be solved, as a result of diligent studies focusing on a structure of a base member, a structure of a pixel, and a layout of driving circuits of a light-emitting panel device. Based on this finding, the inventors of the present invention attained the present invention.

Specifically, in order to attain the above objects, an image display device of the present invention includes a plurality of panels, the plurality of panels each including: a rectangular light-emitting section in which a plurality of pixels each including a plurality of light-emitting elements are provided, the plurality of light-emitting elements having a first electrode and a second electrode and emitting light as a result of electric current supply or voltage application; a base member having a flat surface on which the rectangular light-emitting section is provided and an adjacent surface that is adjacent to one of edge portions of the flat surface which extend along a pair of long sides of the rectangular light-emitting section, the base member being curved or bent in the adjacent surface in a direction in which the flat surface is warped outwards; a first terminal group drawn out from the first electrode of the rectangular light-emitting section, the first terminal group being formed in the adjacent surface; and a second terminal group drawn out from the second electrode of the plurality of light-emitting elements, the second terminal group being formed on the flat surface along one of a pair of short sides of the rectangular light-emitting section, the plurality of panels including a first panel and a second panel that is different from the first panel, the first panel and the second panel being connected to each other by linking one of the edge portions of the flat surface of the first panel and one of the edge portions of the flat surface of the second panel so that (i) the light-emitting section of the first panel and the light-emitting section of the second panel are disposed in a same direction and (ii) a longitudinal direction of the light-emitting section of the first panel is parallel to that of the light-emitting section of the second panel, the light-emitting sections of the plurality of panels being combined to constitute an image display section in which the plurality of pixels are arranged in a matrix, the plurality of light-emitting elements included in each of the plurality of pixels being aligned in a column direction of the matrix, the image display device further comprising: a scan driving circuit connected to one of the first terminal group and the second terminal group which one is drawn out in a row direction of the matrix, the scan driving circuit outputting a scanning signal which sets the plurality of light-emitting elements to a selection state; and a data driving circuit connected to one of the first terminal group and the second terminal group which one is drawn out in the column direction of the matrix, the data driving circuit supplying a data signal to the plurality of light-emitting elements set to the selection state by the scanning signal.

According to the arrangement, a terminal extending from one of the electrodes of the light-emitting elements (e.g., organic electroluminescence elements) in each of the pixels aligned in a long side direction (longitudinal direction) of the rectangular light-emitting section can be drawn out into the adjacent surface and be connected to a driving circuit in the adjacent surface.

This arrangement in which the driving circuit can be thus disposed makes it possible to connect (link) the first panel and the second panel so that no spacing exists between the light-emitting section of the first panel and the light-emitting section of the second panel. This is because the adjacent surface (of the first panel) in which the driving circuit is disposed is present in the vicinity of a seam (connection section) between the light-emitting section of the first panel and the light-emitting section of the second panel so as to be curved and protrude towards the rear surface side of the base member.

Note that a terminal of the other one of the electrodes is drawn out into a region of the flat surface of the base member which region can be located along one of short sides of the rectangular light-emitting section and be connected to another driving circuit in the region. Since a terminal extending from the second electrode of the light-emitting section of each panel is disposed on a flat surface of the panel, a length of a wire extending from the second electrode to the terminal can be made short. In a case where organic electroluminescence elements are used as the light-emitting elements, an electric current is required for light emission of the organic electroluminescence elements since the organic electroluminescence elements are driven by an electric current. Accordingly, an electric current supply wire is connected, as the wire, to the second electrode. It is known that a conventional display (display device) having a long electric current supply wire has a problem that a resistive component in the electric current supply wire causes, as a result of passage of an electric current, a decline in voltage, which leads to a rise in power consumption, and heat generation. The reduction in length of the electric current supply wire according to the present invention is very effective for solution of the problem. Especially in a large-sized high-resolution display (display device), an increase in pixel area resulting from an increase in the number of pixels and an increase in display region of the display (display device) makes it necessary to supply larger amounts of electric current through the electric current supply wire. Accordingly, the aforementioned problem becomes more severe. According to the present invention, it is possible to solve the problem caused by passing an electric current through the electric current supply wire. This allows for a large decline in power consumption and a large decline in heat generation.

As a result, it is possible to produce a large-sized light-emitting panel device which consumes less power and generates less heat. Use of this light-emitting panel device in an image display device makes it possible to produce a large-sized display device that is excellent in display quality.

Further, according to the arrangement of the present invention, the adjacent surface is not observed in a seam between panels, and the first panel and the second panel can be connected to each other so that a longitudinal direction of the rectangular light-emitting section of the first panel is parallel with a longitudinal direction of the rectangular light-emitting section of the second panel and so that the edge portion of the flat surface of the base member of the first panel is connected to the edge portion of the flat surface of the base member of the second panel. By connecting panels in this manner, an unlimited number of panels can be connected. It is thus possible to produce a single large light-emitting section by connecting light-emitting sections of the respective panels with no space therebetween.

In other words, since an unlimited number of panels can be connected according to the arrangement of the present invention, a reduction is size is possible by reducing a size of individual panels to be combined to a desired area. It is thus possible to provide a panel that can be reduced in cost.

According to the arrangement of the present invention, the light-emitting section has a rectangular shape. This makes it possible to, even in a case where organic electroluminescence (EL) elements are provided as the light-emitting elements, (i) easily perform mask processing for color patterning in a mask deposition method using a conventional shadow mask, (ii) easily achieve high mask alignment accuracy, and (iii) eliminate a risk of misalignment caused by flexure of the mask.

Further, since a size of an image display device can be increased even with the use of a small-sized panel manufacturing device, a manufacturing cost can be reduced. Accordingly, use of the image display device of the present invention makes it possible to provide a large-sized organic EL display and a large-sized organic EL image display device at lower cost.

According to the present invention, panels are connected to each other by linking one panel to a long side of a light-emitting section of another panel, as described above. This makes it possible to produce a large-sized image display device with the use of the smaller number of panels as compared with a case where the panels are connected to each other by linking one panel to a short side of a light-emitting section of another panel, provided that the panels are same in width (length of a short side of the light-emitting section of each panel). Specifically, assume that a 65-inch high-vision television that is 1400 mm in horizontal length (long side of a final product) and 800 mm in vertical length (short side of the final product) is produced. The following discusses (i) a case where panels each having a width of 100 mm are combined in a short side direction of the final product and (ii) a case where the panels each having a width of 100 mm are combined in a long side direction of the final product. In a case where the panels are combined in the short side direction of the final product in the image display device of the present embodiment, each of the panels has a size of 1400 mm×100 mm. As such, the final product can be obtained by combining eight panels. Meanwhile, in a case where the panels are combined in the long side direction of the final product, each of the panels has a size of 800 mm×100 mm. As such, fourteen panels are required in order to obtain the final product.

Consequently, a large-sized light-emitting panel device can be produced with the small number of connection sections. A large-sized image display device can be produced by applying this light-emitting panel device to the image display device.

Since the image display device of the present invention is produced by combining a plurality of panels, an increase in the number of panels causes an increase in the number of adjacent surfaces in the image display device. Accordingly, the number of driving circuits connected to a terminal provided on the adjacent surface increases. This causes an increase in cost. As such, an arrangement which requires the smaller number of driving circuits is more desirable. It is especially desirable to reduce the number of data driving circuits since a data driving circuit is more expensive than a scanning driving circuit.

According to an arrangement of a conventional image display device, pixels are arranged in a matrix in the image display section, and a plurality of light-emitting elements in each pixel are aligned in a row direction of the matrix. In this case, a plurality of (the number of light-emitting elements provided in each pixel) data signal lines or signal electrodes are necessary per pixel. Meanwhile, in the image display device of the present invention, a plurality of light-emitting elements in each pixel are aligned in a column direction of the matrix. Accordingly, only a single data signal line or signal electrode is required per pixel. Consequently, the number of corresponding data driving circuits can be made smaller than that in the conventional display panel. This allows for a reduction in cost.

In order to attain the above objects, an image display device of the present invention may be arranged to include a plurality of panels, the plurality of panels each including: a rectangular light-emitting section in which a plurality of pixels each including a plurality of light-emitting elements are provided, the plurality of light-emitting elements having a first electrode and a second electrode and emitting light as a result of electric current supply or voltage application; a base member having a flat surface on which the rectangular light-emitting section is provided and an adjacent surface that is adjacent to one of edge portions of the flat surface which extend along a pair of long sides of the rectangular light-emitting section, the base member being curved or bent in the adjacent surface in a direction in which the flat surface is warped outwards; a first terminal group drawn out from the first electrode of the rectangular light-emitting section, the first terminal group being formed in the adjacent surface; and a second terminal group drawn out from the second electrode of the plurality of light-emitting elements, the second terminal group being formed on the flat surface along one of a pair of short sides of the rectangular light-emitting section, the plurality of panels including a first panel and a second panel that is different from the first panel, the first panel and the second panel being connected to each other by linking one of the edge portions of the flat surface of the first panel and one of the edge portions of the flat surface of the second panel so that (i) the light-emitting section of the first panel and the light-emitting section of the second panel are disposed in a same direction and (ii) a longitudinal direction of the light-emitting section of the first panel is parallel to that of the light-emitting section of the second panel, the light-emitting sections of the plurality of panels being combined to constitute an image display section in which the plurality of pixels are arranged in a matrix, the longitudinal direction being parallel with a row direction of the matrix, the plurality of light-emitting elements included in each of the plurality of pixels being aligned in the row direction or a column direction of the matrix, the image display device further comprising: a scan driving circuit connected to the first terminal group, the scan driving circuit outputting a scanning signal which sets the plurality of light-emitting elements to a selection state; and a data driving circuit connected to the second terminal group, the data driving circuit supplying a data signal to the plurality of light-emitting elements set to the selection state by the scanning signal.

Even according to the arrangement, similar effects to those of the above image display device can be obtained.

The present invention also encompasses a panel itself which is a constituent member of the above image display device.

Specifically, the present invention encompasses a panel including: a rectangular light-emitting section in which a plurality of pixels each including a plurality of light-emitting elements are provided, the plurality of light-emitting elements having a first electrode and a second electrode and emitting light as a result of electric current supply or voltage application; a base member having a flat surface on which the rectangular light-emitting section is provided and an adjacent surface that is adjacent to one of edge portions of the flat surface which extend along a pair of long sides of the rectangular light-emitting section, the base member being curved or bent in the adjacent surface in a direction in which the flat surface is warped outwards; and a terminal group drawn out from the first electrode of the rectangular light-emitting section, the terminal group being formed in the adjacent surface, the plurality of light-emitting elements included in each of the plurality of pixels being aligned in a direction parallel with the pair of short sides of the rectangular light-emitting section.

Further, the present invention encompasses a method for manufacturing the panel provided in the image display device.

Specifically, the present invention encompasses a method for manufacturing a panel provided in the image display device, including the steps of: (a) preparing the base member having the flat surface and the adjacent surface; and (b) forming organic electroluminescence elements on the flat surface of the base member prepared in the step (a), the organic electroluminescence elements being the light-emitting elements having the first electrode and the second electrode and emitting light as a result of electric current supply or voltage application, the step (b) including the steps of: (c) forming the first electrode or the second electrode on the flat surface of the base member; and (d) forming, by an in-line deposition process, the organic layer on the electrode formed in the step (c), the organic layer being provided between the first electrode and the second electrode in the organic electroluminescence elements.

According to the arrangement, the organic layer is formed by using an in-line deposition method. It is therefore possible to perform color patterning utilizing mask deposition using a shadow mask by exploiting the advantage of an in-line deposition device, which has high productivity, to the greatest extent possible.

Specifically, according to the organic EL color patterning method using a shadow mask, a deposition source (source), a shadow mask, and a substrate are generally disposed in this order in an upward direction. Because of an increase in size of a mask that results from an increase in size of a substrate, conventionally, a method of reducing flexure of a mask by bonding the mask on a rigid frame while keeping the tension on the mask has been employed. Nevertheless, problems such as color registration error, mixture of colors, a non-light-emitting pixel (non-light-emitting line), and a rise in power consumption caused by leakage occur due to flexure of a mask. These are regarded as the biggest problems for an organic EL display. Meanwhile, the method of the present invention allows a length of a side of a panel to be much shorter than that of a final product. In a case where film formation is performed with the use of an in-line deposition device by moving a base member in a long side direction of a panel, it is possible to extremely reduce a mask width. This can eliminate flexure of the mask.

As a result, it is possible to solve the problems such as color registration error, mixture of colors, a non-light-emitting pixel (non-light-emitting line), and a rise in power consumption caused by leakage. Accordingly, it is possible to efficiently produce a panel which can be reduced in cost and power consumption. Consequently, the light-emitting panel device using the panel can be reduced in cost and power consumption. Similarly, these effects can be obtained also in the image display device and the illumination device of the present invention each of which includes the light-emitting panel device.

Advantageous Effects of Invention

As described above, the image display device of the present invention includes a plurality of panels, the plurality of panels each including: a rectangular light-emitting section in which a plurality of pixels each including a plurality of light-emitting elements are provided, the plurality of light-emitting elements having a first electrode and a second electrode and emitting light as a result of electric current supply or voltage application; a base member having a flat surface on which the rectangular light-emitting section is provided and an adjacent surface that is adjacent to one of edge portions of the flat surface which extend along a pair of long sides of the rectangular light-emitting section, the base member being curved or bent in the adjacent surface in a direction in which the flat surface is warped outwards; a terminal group drawn out from the first electrode of the rectangular light-emitting section, the terminal group being formed in the adjacent surface; and a second terminal group drawn out from the second electrode of the plurality of light-emitting elements, the second terminal group being formed on the flat surface along one of a pair of short sides of the rectangular light-emitting section, the plurality of panels including a first panel and a second panel that is different from the first panel, the first panel and the second panel being connected to each other by linking one of the edge portions of the flat surface of the first panel and one of the edge portions of the flat surface of the second panel so that (i) the light-emitting section of the first panel and the light-emitting section of the second panel are disposed in a same direction and (ii) a longitudinal direction of the light-emitting section of the first panel is parallel to that of the light-emitting section of the second panel, the light-emitting sections of the plurality of panels being combined to constitute an image display section in which the plurality of pixels are arranged in a matrix, the plurality of light-emitting elements included in each of the plurality of pixels being aligned in a column direction of the matrix, the image display device further comprising: a scan driving circuit connected to one of the first terminal group and the second terminal group which one is drawn out in a row direction of the matrix, the scan driving circuit outputting a scanning signal which sets the plurality of light-emitting elements to a selection state; and a data driving circuit connected to one of the first terminal group and the second terminal group which one is drawn out in the column direction of the matrix, the data driving circuit supplying a data signal to the plurality of light-emitting elements set to the selection state by the scanning signal.

Alternatively, the image display device of the present invention includes a plurality of panels, the plurality of panels each including: a rectangular light-emitting section in which a plurality of pixels each including a plurality of light-emitting elements are provided, the plurality of light-emitting elements having a first electrode and a second electrode and emitting light as a result of electric current supply or voltage application; a base member having a flat surface on which the rectangular light-emitting section is provided and an adjacent surface that is adjacent to one of edge portions of the flat surface which extend along a pair of long sides of the rectangular light-emitting section, the base member being curved or bent in the adjacent surface in a direction in which the flat surface is warped outwards; a first terminal group drawn out from the first electrode of the rectangular light-emitting section, the first terminal group being formed in the adjacent surface; and a second terminal group drawn out from the second electrode of the plurality of light-emitting elements, the second terminal group being formed on the flat surface along one of a pair of short sides of the rectangular light-emitting section, the plurality of panels including a first panel and a second panel that is different from the first panel, the first panel and the second panel being connected to each other by linking one of the edge portions of the flat surface of the first panel and one of the edge portions of the flat surface of the second panel so that (i) the light-emitting section of the first panel and the light-emitting section of the second panel are disposed in a same direction and (ii) a longitudinal direction of the light-emitting section of the first panel is parallel to that of the light-emitting section of the second panel, the light-emitting sections of the plurality of panels being combined to constitute an image display section in which the plurality of pixels are arranged in a matrix, the longitudinal direction being parallel with a row direction of the matrix, the plurality of light-emitting elements included in each of the plurality of pixels being aligned in the row direction or a column direction of the matrix, the image display device further comprising: a scan driving circuit connected to the first terminal group, the scan driving circuit outputting a scanning signal which sets the plurality of light-emitting elements to a selection state; and a data driving circuit connected to the second terminal group, the data driving circuit supplying a data signal to the plurality of light-emitting elements set to the selection state by the scanning signal.

With the arrangements, the number of panels to be combined (connected) is not limited, the seam problem is solved, and a reduction in size is possible by reducing individual panels to be combined to a desired area even in the case of production of a large-sized panel. Further, it is possible to suppress an increase in cost caused by an increase in the number of driving circuits that results from use of a plurality of panels.

BRIEF DESCRIPTION OF DRAWINGS

FIG. 1 is a perspective view illustrating a configuration of an image display device of an embodiment of the present invention.

FIG. 2 is a perspective view of a panel constituting the image display device illustrated in FIG. 1.

FIG. 3 is an enlarged perspective view of configurations of pixels in part of the image display device of the embodiment of the present invention.

FIG. 4 is an enlarged perspective view of other configurations of pixels in part of the image display device of the embodiment of the present invention.

FIG. 5 is a diagram illustrating a voltage driving digital gradation type driving circuit which is a driving mode of the image display device of the present embodiment illustrated in FIG. 1.

Figure 6:
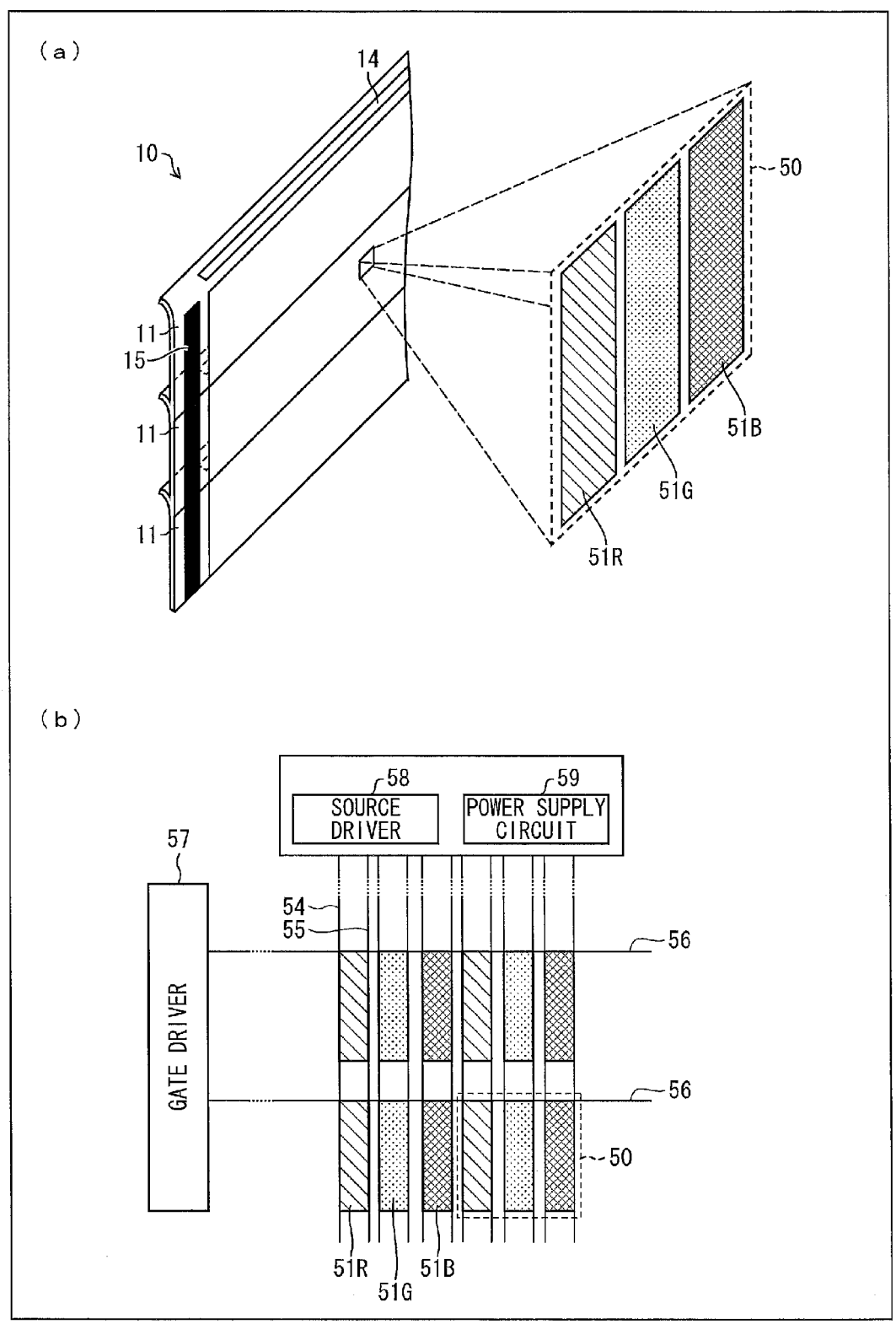
FIG. 6

(a) of FIG. 6 is a perspective view illustrating a configuration of a pixel of an image display device for comparison, and (b) of FIG. 6 is a diagram illustrating an outline of a circuit configuration in (a) of FIG. 6.

FIG. 7

Figure 7:
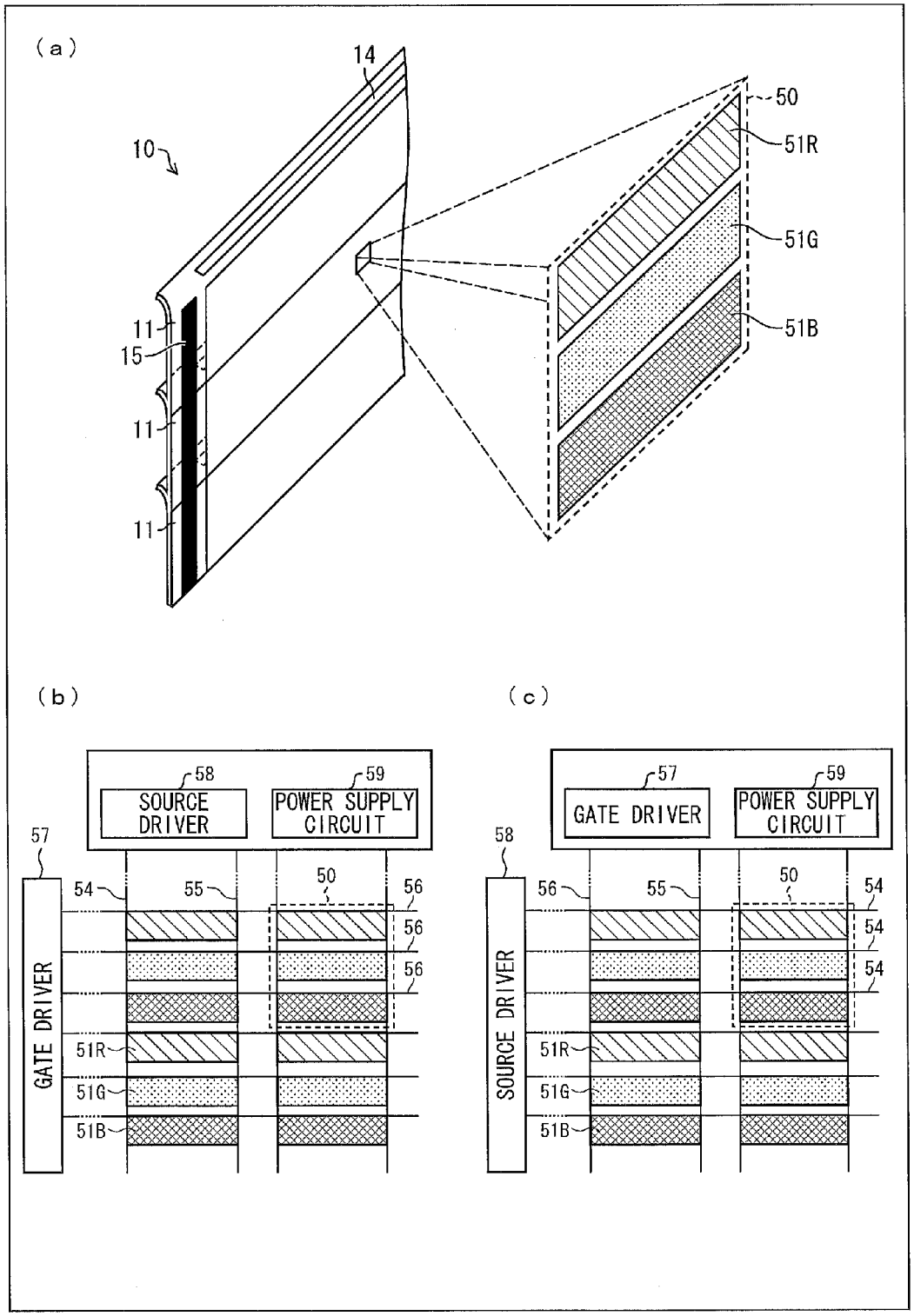

(a) of FIG. 7 is a perspective view illustrating a configuration of a pixel of the image display device of the embodiment of the present invention, (b) of FIG. 7 is a diagram illustrating an outline of a circuit configuration in (a) of FIG. 7, and (c) of FIG. 7 is a diagram illustrating an outline of another circuit configuration in (a) of FIG. 7.

FIG. 8

Figure 1:
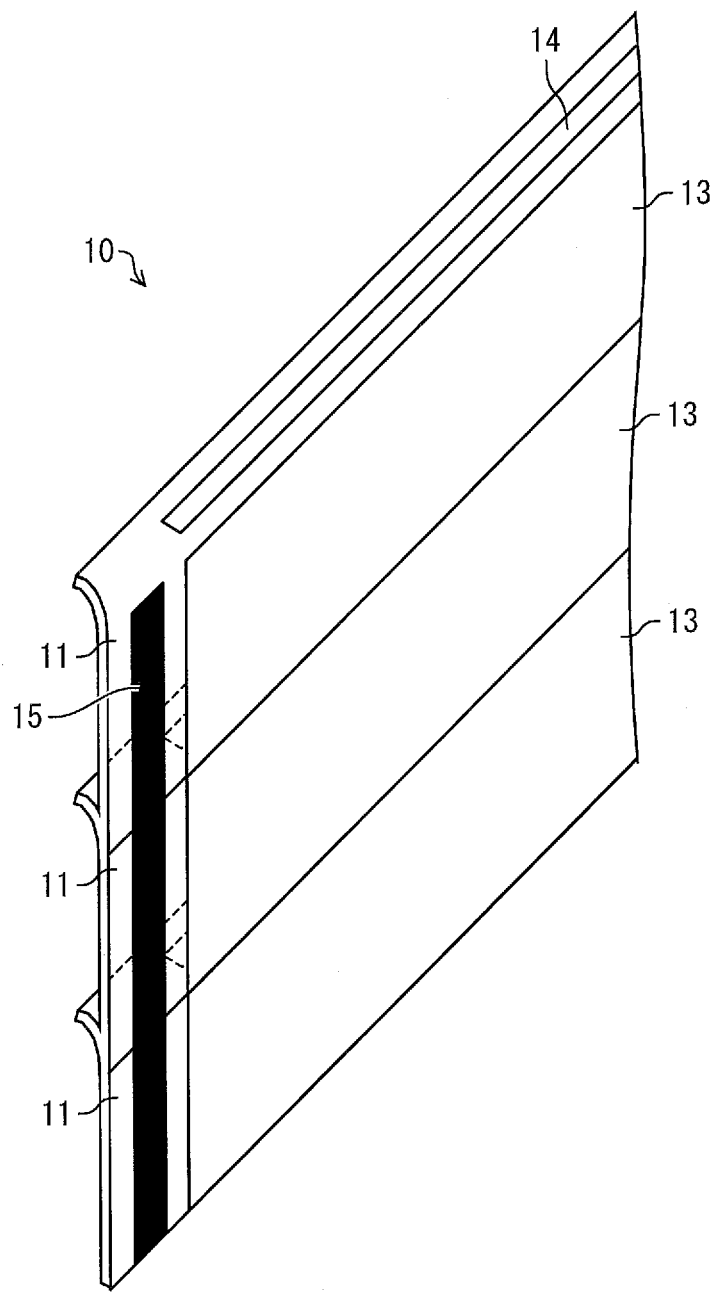
FIG. 1
Figure 8:
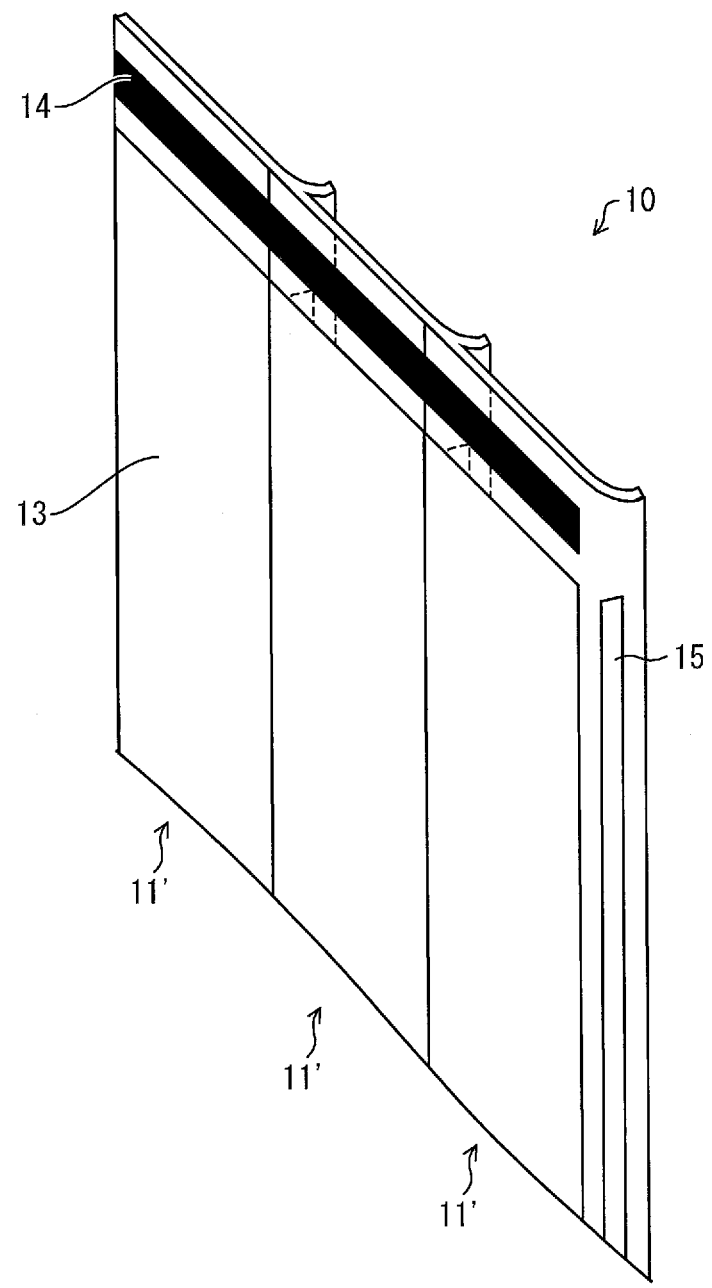

FIG. 8 is a diagram explaining another way in which panels constituting the image display device illustrated in FIG. 1 are connected.

FIG. 9

Figure 9:
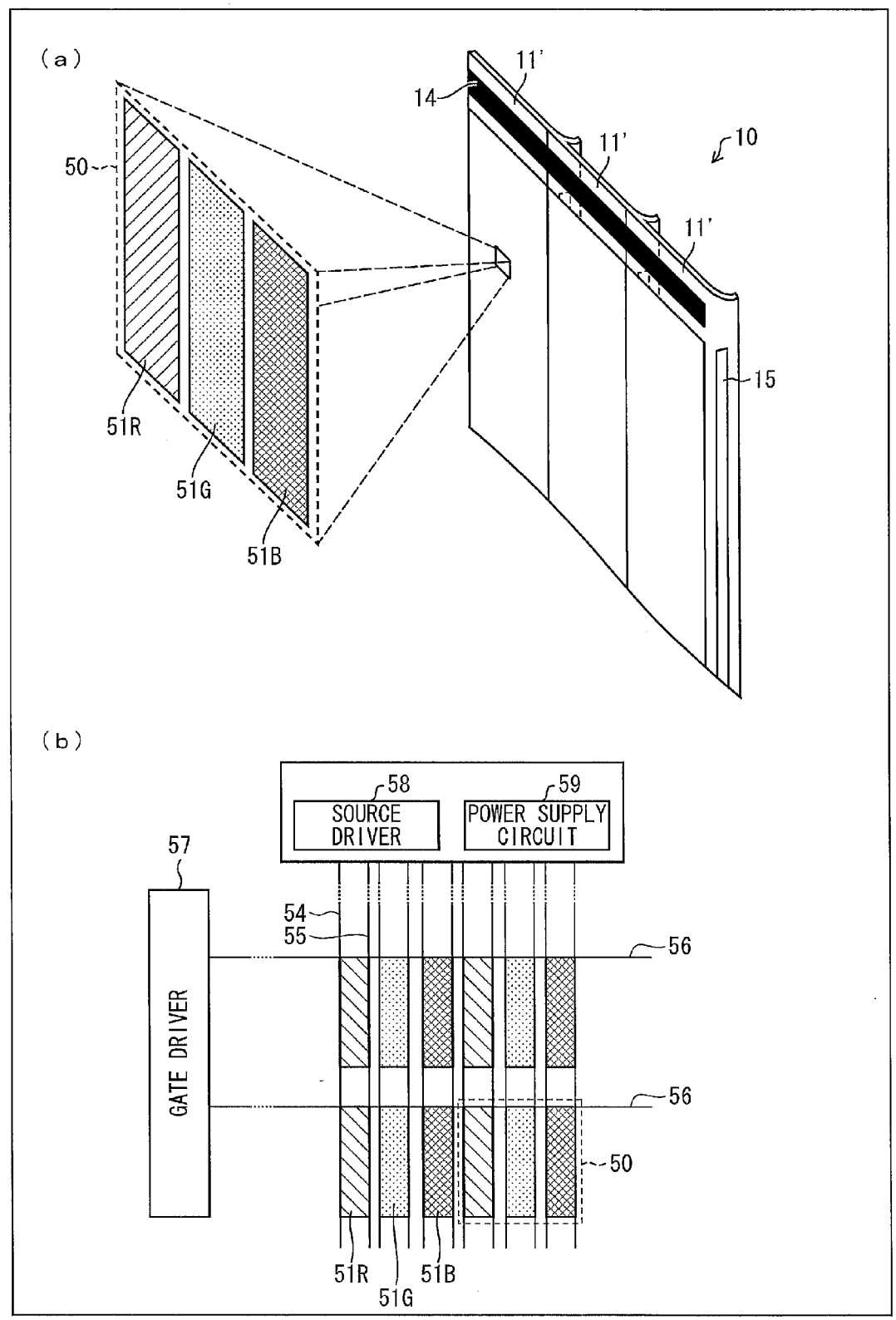

(a) of FIG. 9 is a perspective view illustrating a configuration of an image display device for comparison and a configuration of a pixel of the image display device for comparison, and (b) of FIG. 9 is a diagram illustrating an outline of a circuit configuration in (a) of FIG. 9.

FIG. 10

Figure 10:
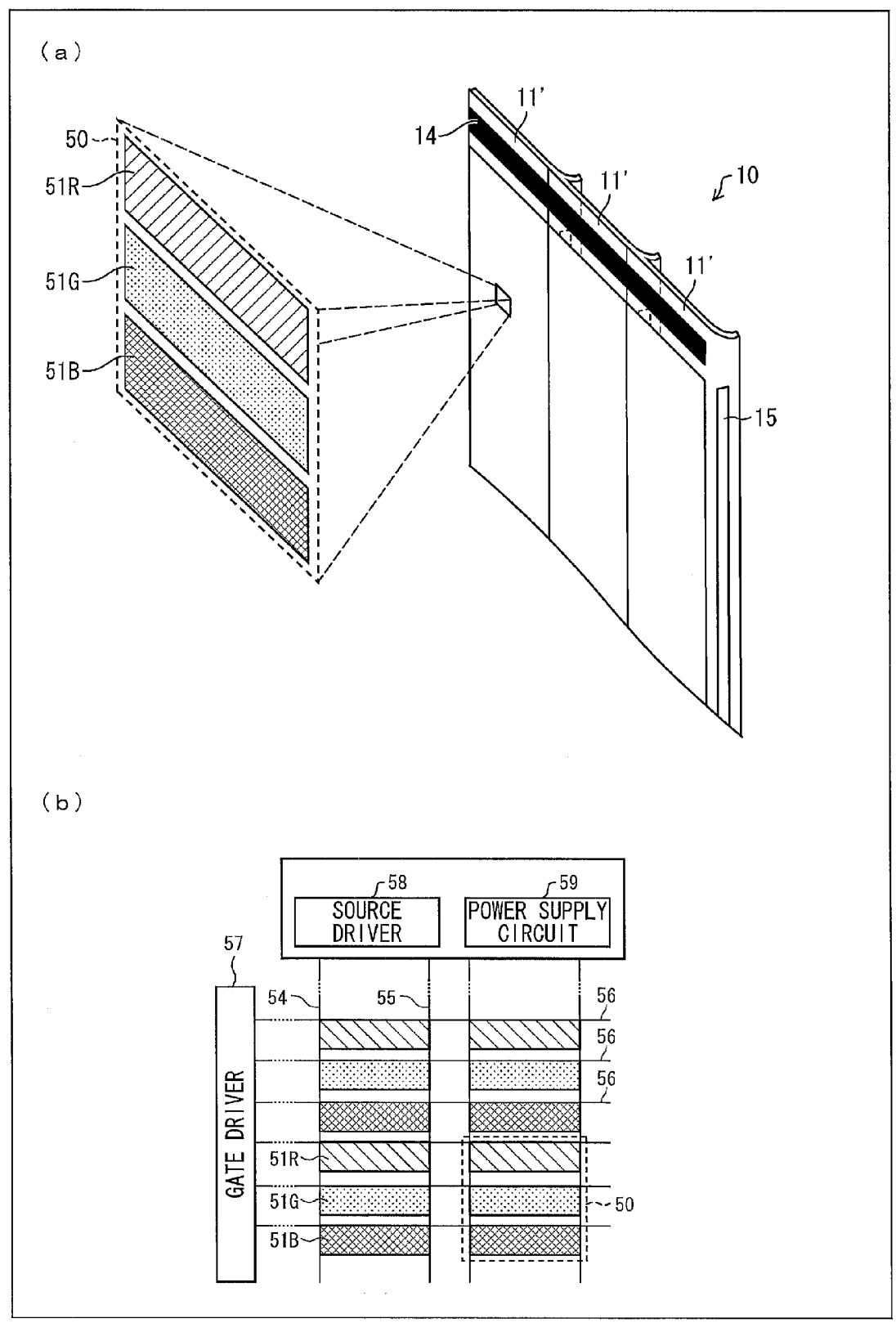

(a) of FIG. 10 is a perspective view illustrating a configuration of an image display device of another embodiment of the present invention and a configuration of a pixel of the image display device, and (b) of FIG. 10 is a diagram illustrating an outline of a circuit configuration in (a) of FIG. 10.

FIG. 11

Figure 11:
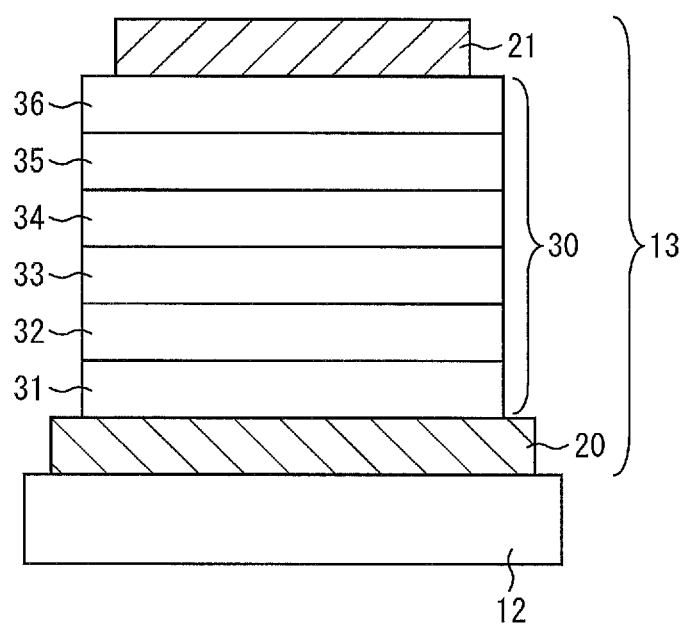

FIG. 11 is a cross-sectional view illustrating a configuration of a display section formed on a panel constituting the image display device illustrated in FIG. 1.

FIG. 12

Figure 12:
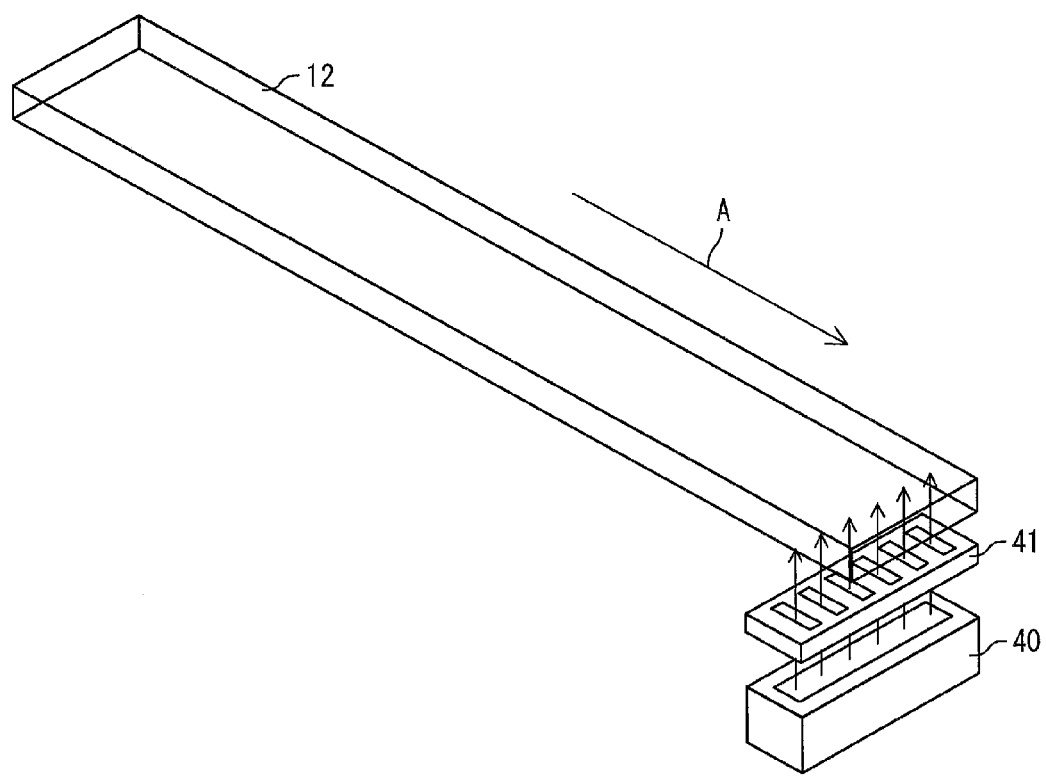

FIG. 12 is a diagram explaining how a panel constituting the image display device illustrated in FIG. 1 is formed.

FIG. 13

Figure 13:
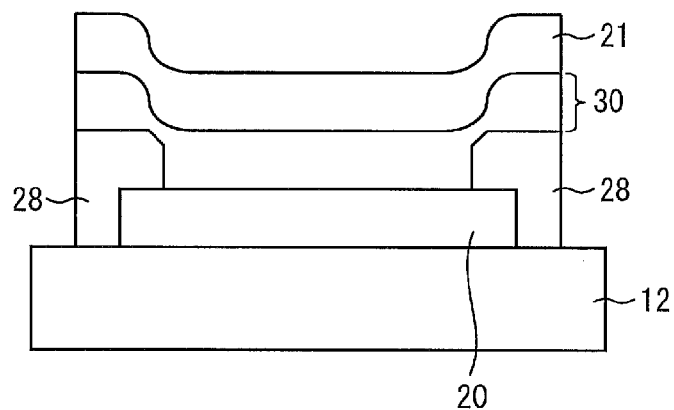

FIG. 13 is a cross-sectional view illustrating a configuration of a display section formed on a panel constituting the image display device illustrated in FIG. 1.

FIG. 14

Figure 14:
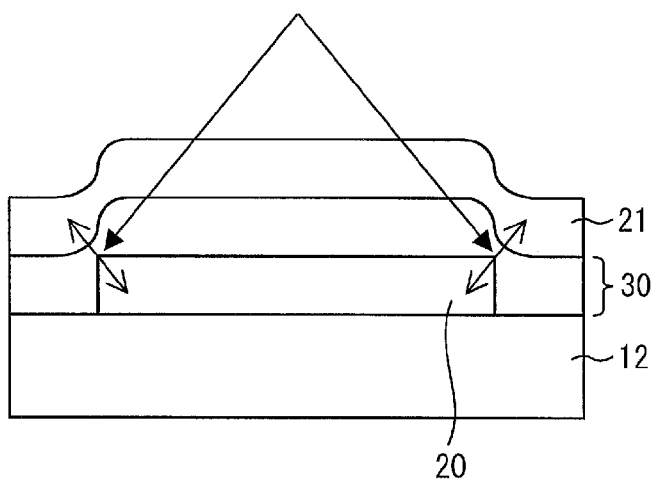

FIG. 14 is a cross-sectional view illustrating a comparative configuration in which no edge cover is provided.

FIG. 15

Figure 15:
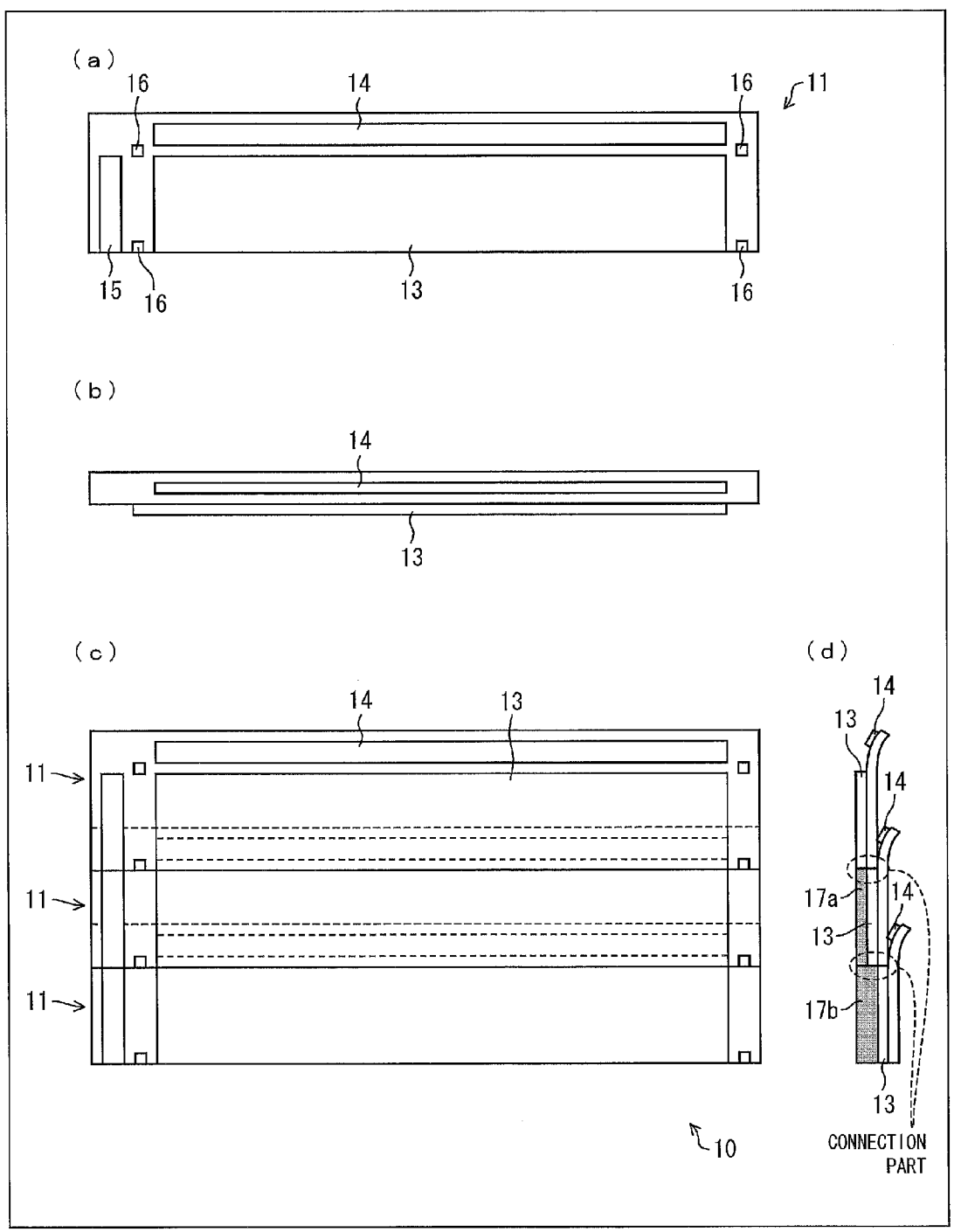

(a) through (d) of FIG. 15 are diagrams explaining how the panels constituting the image display device illustrated in FIG. 1 are connected, (a) of FIG. 15 is an elevation view of a panel, (b) of FIG. 15 is a top view of the panel, (c) of FIG. 15 is an elevation view of the image display device constituted by connected panels (viewed from a display section side), and (d) of FIG. 15 is a side view of the image display device illustrated in (c) of FIG. 15.

FIG. 16

Figure 16:
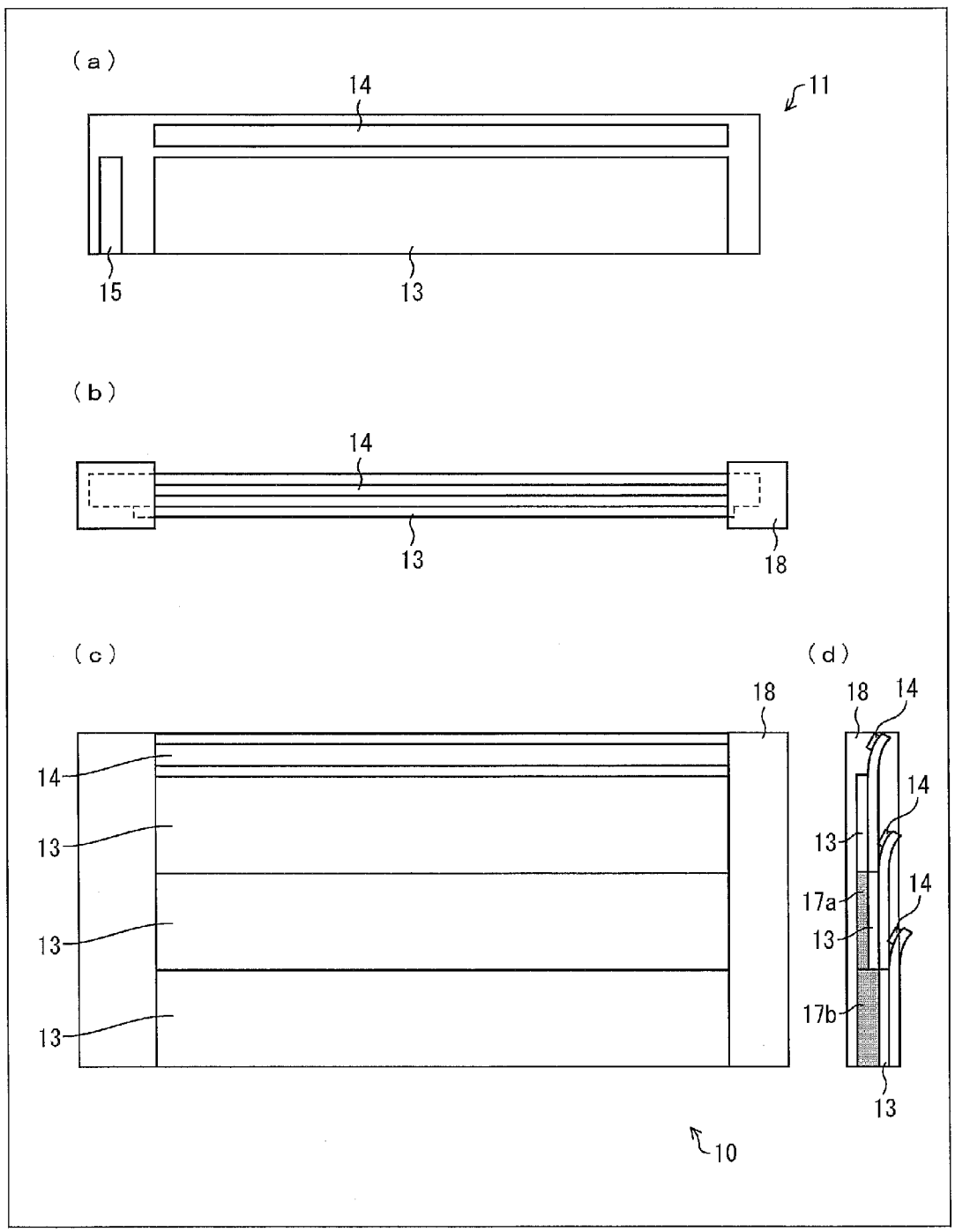

FIG. 16 is a diagram explaining another way in which panels constituting the image display device illustrated in FIG. 1 are connected.

FIG. 17

Figure 17:
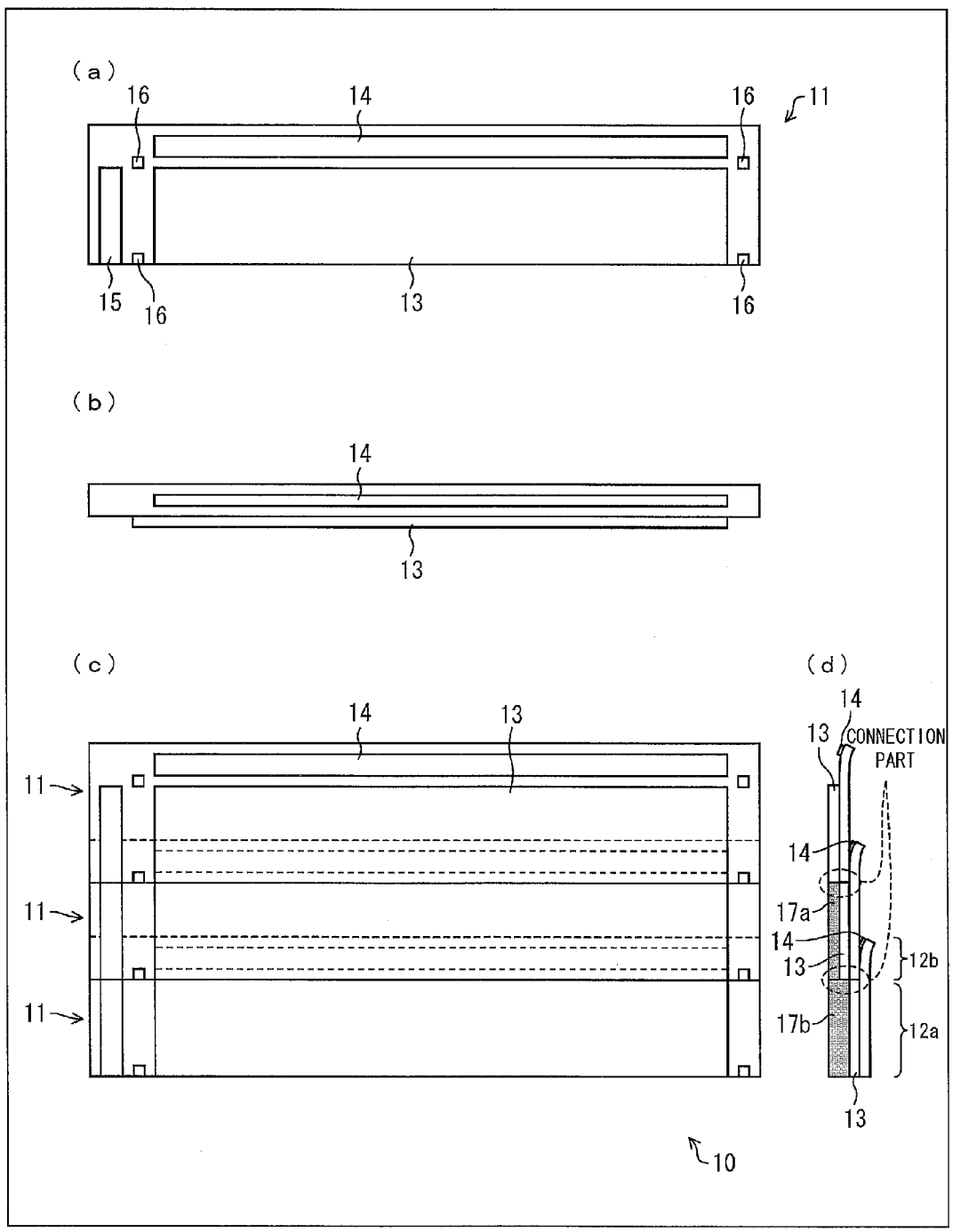

FIG. 17 is a diagram explaining another way in which panels constituting the image display device illustrated in FIG. 1 are connected.

FIG. 18

Figure 18:
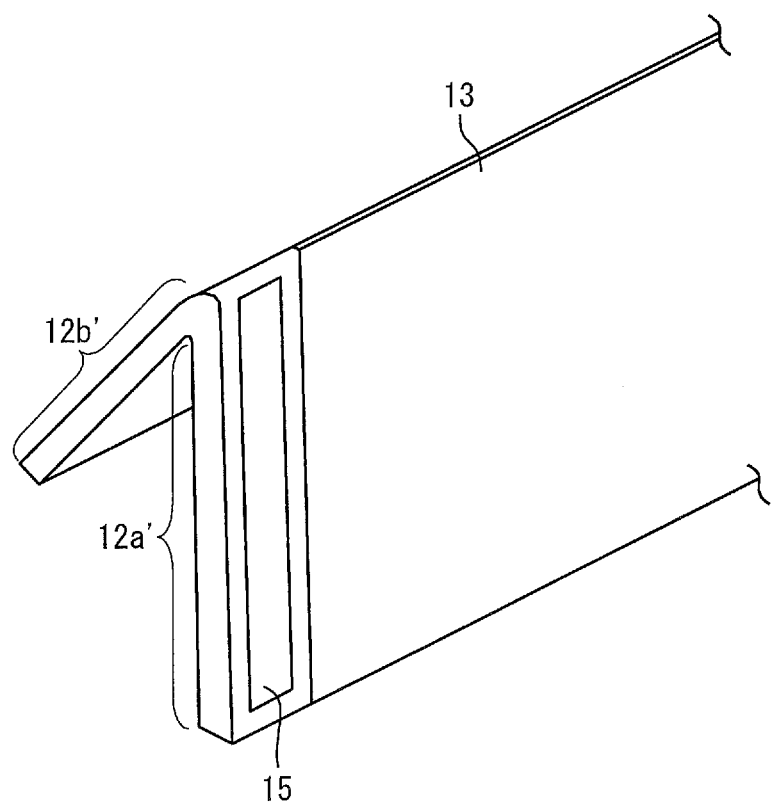

FIG. 18 is a perspective view illustrating another form of a panel constituting the image display device illustrated in FIG. 1.

FIG. 19

Figure 19:
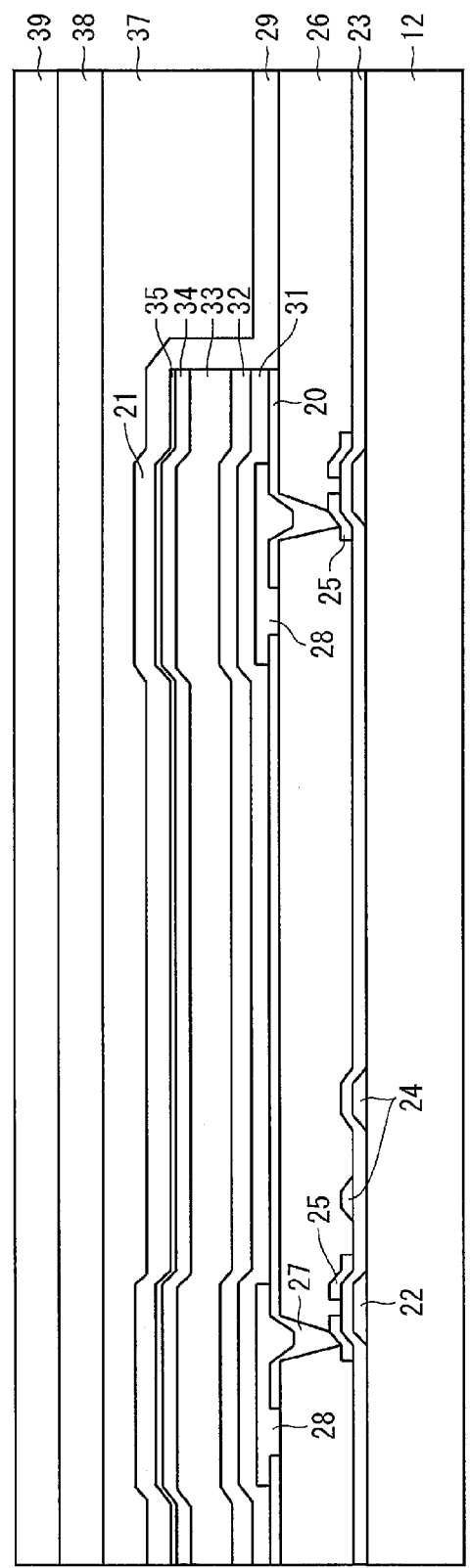

FIG. 19 is a cross-sectional view illustrating a configuration of a panel of Example.

FIG. 20

Figure 20:
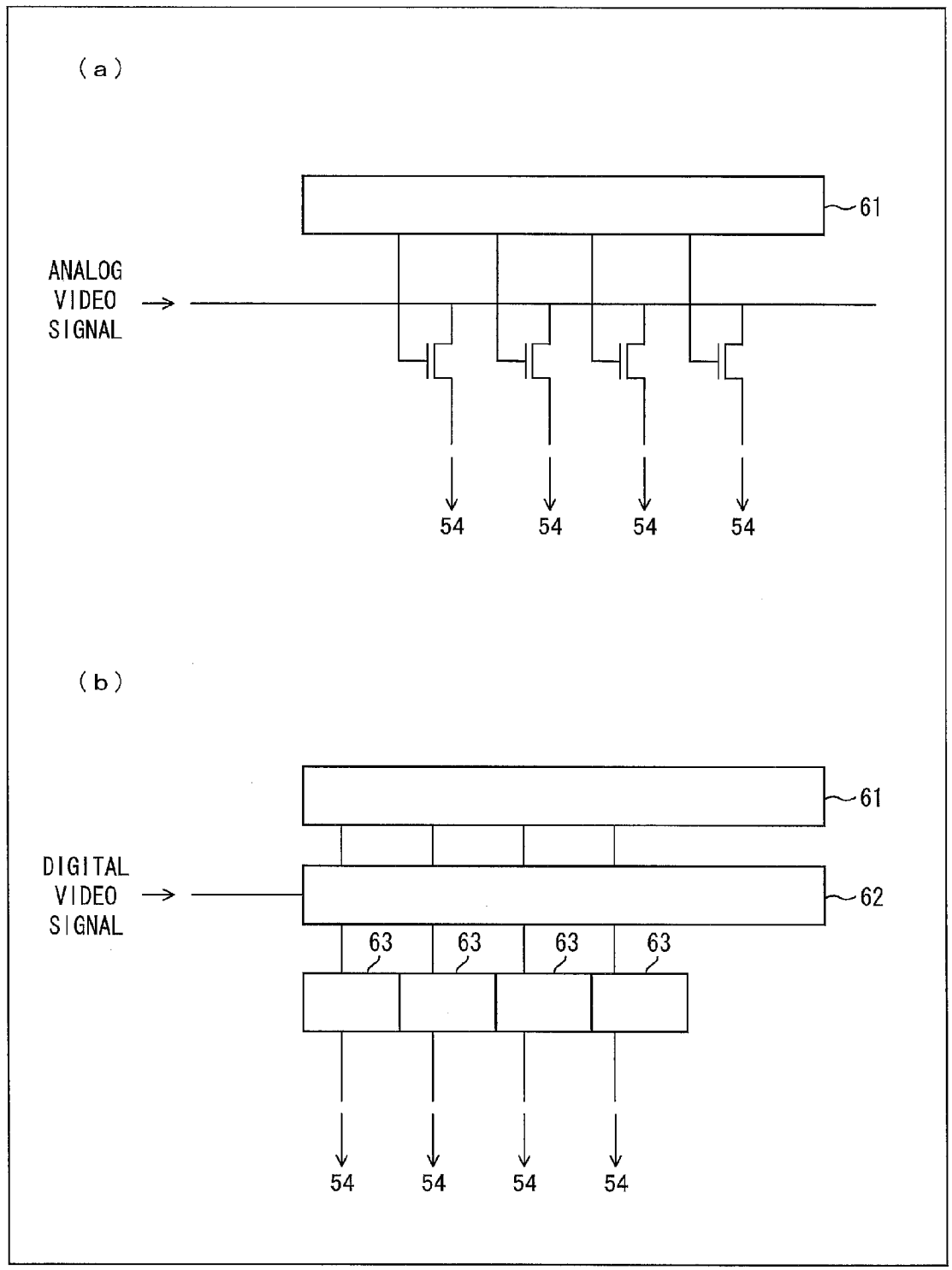

(a) of FIG. 20 is a diagram illustrating a configuration of a dot sequential driving circuit, and (b) of FIG. 20 is a diagram illustrating a configuration of a line sequential driving circuit.

DESCRIPTION OF EMBODIMENTS

An embodiment of the present invention is described below with reference to FIGS. 1 through 20. An image display device of the present embodiment can be used as a display device, such as a television receiver, which has a function of displaying an image (video).

In an image display device exemplified below as an embodiment, a feature of the present invention lies in a panel which has a rectangular display section in which organic electroluminescence (EL) elements are provided. The following describes a configuration of the image display device of the present embodiment, focusing on a detailed configuration of a panel and a method for manufacturing the panel.

[1] Configuration of Image Display Device

FIG. 1 is a perspective view illustrating part of the configuration of the image display device of the present embodiment. As illustrated in FIG. 1, the image display device includes an image display member 10 and an external driving circuit (not illustrated).

Figure 2:
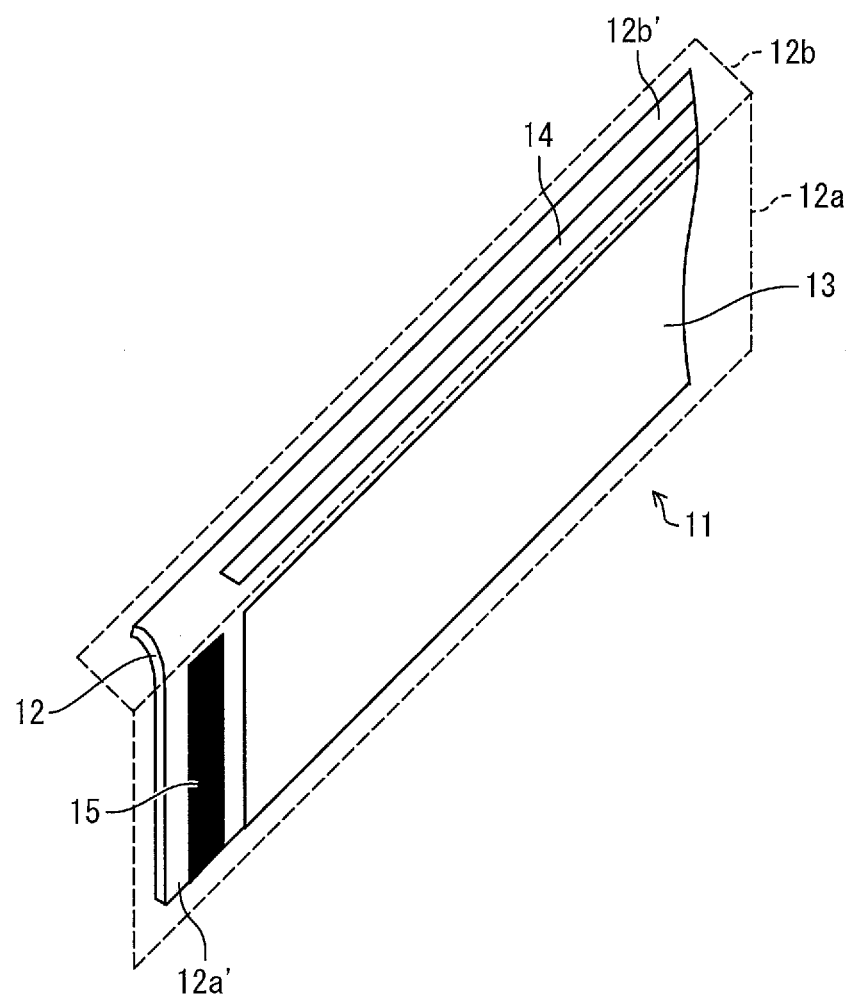
FIG. 2

The image display member 10 includes a plurality of panels 11 (three panels 11 in FIG. 1) which are connected to each other and each of which includes a rectangular display section 13 illustrated in FIG. 2. This is described later in detail. The external driving circuit is electrically connected to each of the plurality of panels 11 so as to drive each of the plurality of panels 11.

The external driving circuit is for driving the display section 13 provided in each of the panels 11 of the image display member 10. The external driving circuit includes a scan electrode circuit, a data signal electrode circuit, and a power supply circuit.

Figure 3:
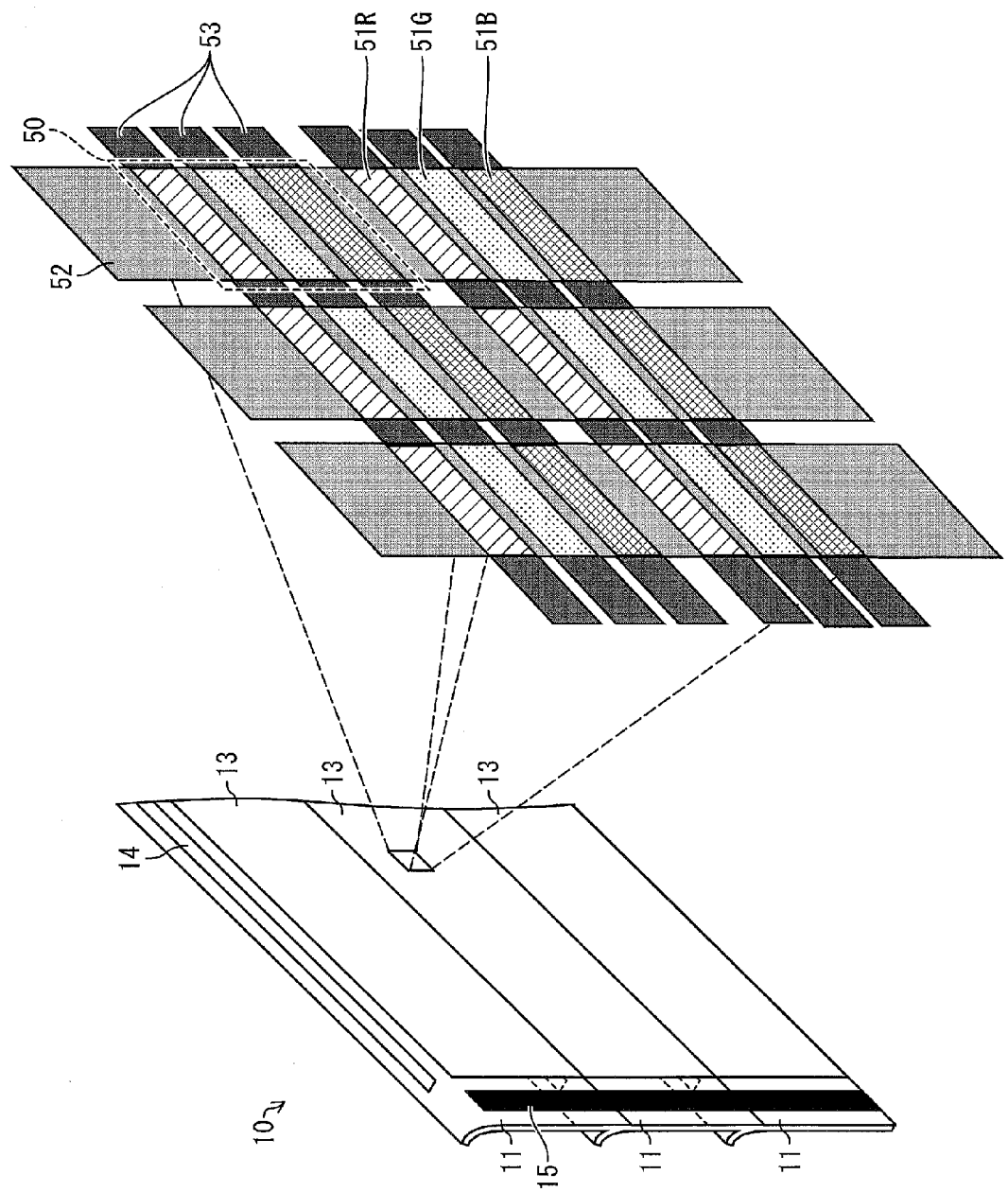
FIG. 3
Figure 4:
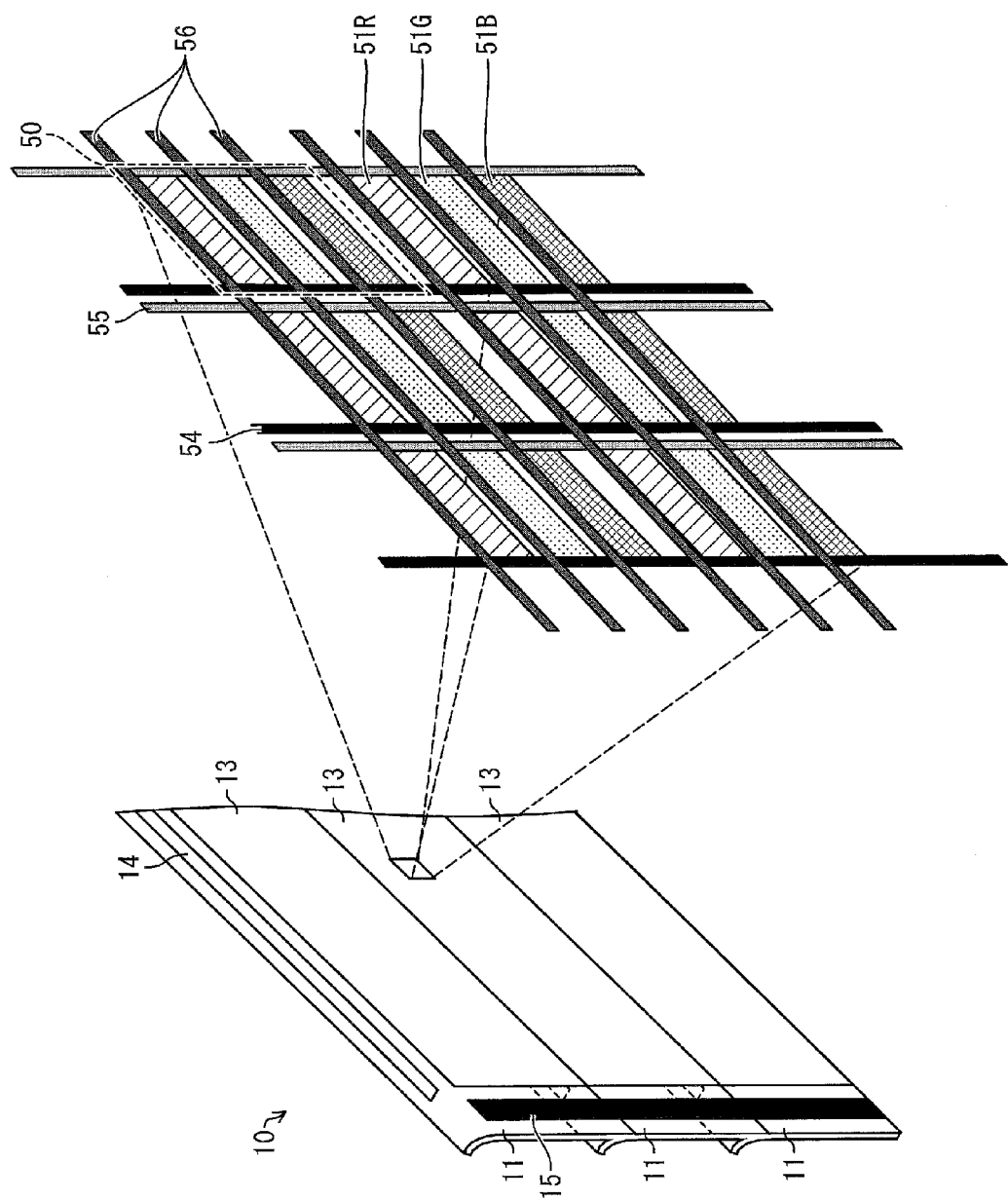
FIG. 4

FIG. 3 and FIG. 4 are enlarged views illustrating a pixel configuration in part of the display section 13 along with the image display member 10. FIG. 3 illustrates a case where the image display device is a simple matrix driving display device, and FIG. 4 illustrates a case where the image display device is an active matrix driving display device. As illustrated in FIG. 3 and FIG. 4, the display section 13 of the image display member 10 includes a plurality of pixels 50 arranged in a matrix. Each of the pixels 50 is constituted by a red (R) sub-pixel 51R, a green (G) sub-pixel 51G, and a blue (B) sub-pixel 51B.

In the image display member 10 illustrated in FIG. 3 and FIG. 4, the sub-pixels in each of the pixels 50 are aligned in a column direction of the matrix. That is, in the image display member 10, the sub-pixels in each of the pixels 50 are aligned in a short side direction of the panels 11. Note that another arrangement is also possible in which the sub-pixels in each of the pixels 50 are aligned in a long side direction of the panels 11 (later described).

In the present embodiment, the panels 11 can be collectively driven by the external driving circuit by electrically connecting the panels 11. Note, however, that the present invention is not limited to this. Alternatively, driving may be carried out by electrically connecting the panels 11 to the external driving circuit independently of each other. For example, in a case where a simple matrix driving image display device in which the sub-pixels 51R, 51G, and 51B are aligned in the short side direction of the panels 11 (the column direction of the matrix of the pixels 50) is produced by connecting the panels 11 as illustrated in FIG. 3, the image display device can be driven as follows. Specifically, terminals (first terminal groups) of H scanners 14 provided in the respective panels 11 so as to be located along long sides of the rectangular display sections 13 are directly electrically connected to each other (specifically, FPCs are connected to the terminals of the H scanners 14, and the FPCs are directly electrically connected to each other). Then, the H scanners 14 are connected to a power supply circuit via a conventional scan electrode circuit provided outside. Meanwhile, a V scanner 15 in which terminal groups (second terminal groups) provided along short sides of the rectangular display sections 13 of the respective panels 11 are disposed is connected to the power supply circuit via a conventional data signal electrode circuit provided outside. The image display device can be thus driven.

Alternatively, the image display device can be driven as follows. Specifically, the H scanners 14 of the respective panels 11 are independently connected to a conventional scan electrode circuit (scanning driving circuit) and a conventional power supply circuit each of which is provided outside. Meanwhile, the V scanner 15 is connected to the power supply circuit via a conventional data signal electrode circuit (data driving circuit) provided outside.

Figure 5:
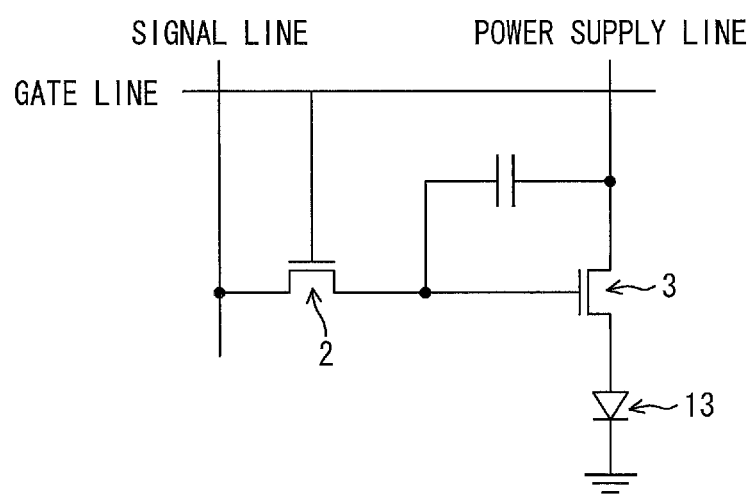
FIG. 5

The image display device of the present embodiment may be configured such that the display sections 13 are active-matrix-driven as illustrated in FIG. 4. In the case of an active matrix driving image display device in which the sub-pixels 51R, 51G, and 51B are aligned in the short side direction of the panels 11 (the column direction of the matrix of the pixels 50), a switching circuit such as a TFT is provided within each of the pixels in the panels 11 as described later. The switching circuit is electrically connected to external driving circuits (a gate driver, a source driver, and a power supply circuit) so that a corresponding rectangular organic EL element is driven. For example, as illustrated in FIG. 5, the image display device is driven according to a voltage driving digital gradation method, two TFTs, i.e., a switching TFT (active matrix driving element) 2 and a driving TFT (active matrix driving element) 3 are provided for each pixel, and the driving TFT 3 is electrically connected to a first electrode provided in the display section 13 via a contact hole formed in a planarizing layer. Further, a capacitor for fixing a gate electric potential of the driving TFT 3 to a constant electric potential is provided for each pixel so as to be connected to a gate part of the driving TFT 3. The planarizing layer is provided on the TFTs. Note, however, that the present invention is not limited to this. The driving may be carried out according to the voltage driving digital gradation method or may be carried out according to an electric current driving analog gradation method. Further, the number of TFTs is not limited in particular. The display section 13 may be driven with the use of the two TFTs as described above. Alternatively, the display section 13 in which a compensation circuit for preventing variation in TFT characteristics (mobility, threshold voltage) is provided for each pixel may be driven with the use of conventional two or more TFTs. For example, in a case where an active matrix driving image display device is produced by connecting the panels 11, the terminals of the H scanners 14 provided in the respective panels 11 so as to be located along the long sides are directly electrically connected to each other (specifically, FPCs are connected to the terminals of the H scanners 14, and the FPCs are directly electrically connected to each other). Then, the H scanners 14 are connected to a conventional source driver (data driving circuit) provided outside. Meanwhile, the V scanners 15 are connected to a conventional gate driver (scanning driving circuit) provided outside. The image display device can be thus driven.

Note, however, that driving may be carried out by connecting the H scanners 14 a conventional gate driver provided outside and by connecting the V scanners 15 to a conventional source driver provided outside as illustrated in (c) of FIG. 7 (later described). In this case, the image display device preferably further includes converting means for causing image signals corresponding to at least 1 screen to be stored in a memory and extracting and outputting the image signals so that an image is displayed in the order from a left column of pixels that are arranged in a matrix.

Further, the source driver and the gate driver may be formed inside a panel by a process similar to a formation process of TFTs constituting a pixel. Further, driving may be carried out by independently connecting the H scanners of the respective panels 11 to a conventional source driver provided outside and by connecting the V scanners to a conventional gate driver provided outside. The source driver and the gate driver may be formed inside a panel by a process similar to a formation process of TFTs constituting a pixel.

The present embodiment mainly deals with a case where a display section as the image display member 10 formed by linking the display sections 13 of the respective panels 11 is longer in a horizontal direction than in a vertical direction (so-called horizontally long). However, the present embodiment is not limited to this. For example, a display device having a display section that is longer in a vertical direction than in a horizontal direction (so-called vertically long) may be obtained by rotating the image display member 10 having the horizontally long display section by 90 degrees.

Next, the following describes a configuration of each of the panels 11 with reference to FIG. 2.

[2] Configuration of Panel

As illustrated in FIG. 2, each of the panels 11 includes a substrate 12, a display section 13, an H scanner 14, and a V scanner 15. A configuration of each of the members is described below.

[Substrate]

As illustrated in FIG. 2, the display section 13, the H scanner 14, and the V scanner 15 are provided on one surface of the substrate 12.

The display section 13 has a rectangular shape as described later, and is formed in a region 12a of the substrate 12. The region 12a is configured as a flat surface 12a' having a rectangular shape like the rectangular display section 13.

The substrate 12 further has a region 12b (hereinafter referred to as "adjacent region 12b") that is provided adjacent to the flat surface so as to be located along one of long sides of the rectangular display section 13. A feature of the present invention lies in this adjacent region.

Specifically, the adjacent region 12b has an adjacent surface 12b' that is flush with the region 12a (the flat surface 12a') in which the display section 13 is formed. The adjacent region 12b has a predetermined width in a direction vertical to a direction in which the long sides of the flat surface extend. The display section 13 is not formed in the adjacent surface 12b'. A characteristic point is that the adjacent surface 12b' is not flat but is curved in a direction in which the surface of the substrate 12 on which surface the display section 13 is formed is warped outwards, as illustrated in FIG. 2.

Examples of the substrate 12 include an insulating substrate such as an inorganic material substrate made of glass, quartz or the like, a plastic substrate made of polyethylene terephthalate, polycarbazole, polyimide, or the like, and a ceramics substrate made of alumina or the like; a metal substrate made of aluminum (Al), iron (Fe), or the like; a substrate obtained by coating a surface of the substrate with an insulator made of silicon oxide ($SiO_2$), an organic insulating material, or the like; and a substrate obtained by subjecting a surface of a metal substrate made of Al or the like to insulating treatment by a method such as an anodic oxidation method. The present invention is not limited to these materials, but the substrate 12 is preferably a plastic substrate or a metal substrate mentioned above since the curved adjacent region can be formed without any stress. The substrate 12 is more preferably a substrate obtained by coating a plastic substrate with an inorganic material or a substrate obtained by coating a metal substrate with an inorganic insulating material. This makes it possible to solve degradation of the display section 13 that is caused by penetration of water, which is the biggest problem that occurs in a case where a plastic substrate is used as the substrate 12 of the panel 11. Moreover, it is possible to solve leakage (short-circuit) caused by projections of a metal substrate, which is the biggest problem that occurs in a case where a metal substrate is used as a substrate for an organic EL display (it is known that leakage of an electric current (short-circuit) frequently occurs in a pixel part due to the projections since thickness of an organic EL display is very small (approximately 100 nm to 200 nm)).

In a case where the substrate 12 is a transparent or semi-transparent substrate, light from the display section 13 can be taken out from a rear surface side of the substrate 12 (far side in a depth direction of the paper on which FIG. 1 is illustrated).

The curved adjacent region 12b (adjacent surface 12b') may be formed by processing of curving an originally flat substrate. Alternatively, the substrate 12 of FIG. 2 may be produced by molding. In the case of curving an originally flat substrate, the processing may be performed before the display section 13 is formed. Alternatively, it is also possible that processing of curving a portion which will become the adjacent region 12b is performed after forming the display section 13 on a flat substrate.

In the present embodiment, the substrate 12 is a single substrate having the region 12a, in which the display section 13 is formed, and the adjacent region 12b. However, the present invention is not limited to this. For example, a single substrate 12 may be produced by bonding a structure (e.g., a flat plate) having the region 12a in which the display section 13 is formed and a structure (e.g., a plate curved in a U-shape) having the adjacent region 12b. In this case, these structures may be made of an identical material or may be made of different materials.

[Another Example of Substrate; Active Matrix Substrate]

As described above, according to the image display device of the present embodiment, the display section 13 can be active-matrix-driven. In order to carry out active matrix driving, the substrate 12 needs to be an active matrix substrate in which a plurality of scanning signal lines 56, a plurality of data signal lines 54, and switching TFTs 2 disposed at respective intersections of the plurality of scanning signal lines 56 and the plurality of data signal lines 54 are provided on a glass substrate, more preferably on a metal substrate or a plastic substrate, further more preferably on a substrate obtained by coating a metal substrate or a plastic substrate with an insulating material.

In a case where a TFT is formed, the substrate 12 is preferably made of a material which does not melt nor distort at a temperature of 500° C. or less. Further, a general metal substrate has a thermal expansion coefficient different from that of glass. Accordingly, it is difficult to form a TFT on a metal substrate by using a conventional production device. However, in a case where a metal substrate made of an iron-nickel alloy having a linear expansion coefficient of $1 \times 10^{-5}$/° C. or less is used so that the linear expansion coefficient of the metal substrate is adjusted to that of glass, it is possible to form a TFT on the metal substrate at low cost by using a conventional production device. In a case where a plastic substrate is used, a TFT is formed on the plastic substrate as follows since the plastic substrate is very low in heat resistance temperature. Specifically, a TFT is formed on a glass substrate, and is then transferred onto the plastic substrate. The TFT can be thus formed on the plastic substrate.

In the above description, the plurality of scanning signal lines 56, the plurality of data signal lines 54, and the switching TFTs 2 disposed at respective intersections of the plurality of scanning signal lines 56 and the plurality of data signal lines 54 are described as constituent elements of the substrate 12. However, the present invention is not limited to this. These members may be constituent elements of the display section 13 (later described).

On the active matrix substrate, an interlayer insulating film and a planarizing film are provided in addition to the TFTs.

The following describes the TFTs, the interlayer insulating film, and the planarizing film in detail.

TFT

The TFTs are formed on the substrate 12 prior to formation of the display section 13. The TFTs serve as switching TFTs and driving TFTs. The TFTs used in the present invention may be, for example, publicly-known TFTs. In the present invention, Metal-Insulator-Metal (MIM) diodes may be used instead of the TFTs.

Each of the TFTs used in the present invention may be formed with the use of publicly-known material, structure, and formation method. Examples of a material for an active layer of the TFT include inorganic semiconductor materials such as noncrystalline silicon (amorphous silicon), polycrystalline silicon (polysilicon), microcrystalline silicon, and cadmium selenide; oxide semiconductor materials such as zinc oxide and indium oxide-gallium oxide-zinc oxide; and organic semiconductor materials such as polythiophene derivative, thiophene oligomer, poly(p-phenylenevinylene) derivative, naphthalene, and pentacene. A structure of the TFT may be, for example, a staggered type, an inversely-staggered type, a top-gate type, or a coplanar type.

Examples of a method for forming the active layer constituting the TFT include (i) a method of performing ion doping so as to introduce an impurity into an amorphous silicon film formed by a plasma enhanced chemical vapor deposition (PECVD) method, (ii) a method of forming amorphous silicon by a low pressure chemical vapor deposition (LPCVD) method using a silane ($SiH_4$) gas, crystallizing the amorphous silicon by a solid-phase epitaxy method so as to obtain polysilicon, and then performing ion doping using ion implantation, (iii) a method of forming amorphous silicon by a LPCVD method using a $Si_2H_6$ gas or a PECVD method using a $SiH_4$ gas, annealing the amorphous silicon with the use of a laser such as a excimer laser, crystallizing the amorphous silicon so as to obtain polysilicon, and then performing ion doping (low temperature process), (iv) a method of forming a polysilicon layer by a LPCVD method or a PECVD method, thermally oxidizing the polysilicon layer at a temperature of 1000° C. or higher so as to form a gate insulating film, forming a n+ polysilicon gate electrode on the gate insulating film, and then performing ion doping (high temperature process), (v) a method of forming an organic semiconductor material by a method such as inkjet method, and (vi) a method of obtaining a monocrystalline film made of an organic semiconductor material.

A gate insulating film of the TFT used in the present invention may be made of a publicly-known material. Examples of such a material include $SiO_2$ formed by a method such as a PECVD method or a LPCVD method and $SiO_2$ obtained by thermally oxidizing a polysilicon film. Further, a signal electrode line, a scan electrode line, a common electrode line, a first driving electrode, and a second driving electrode of the TFT used in the present invention may be made of a publicly-known material. Examples of such a material include tantalum (Ta), aluminum (Al), and copper (Cu). The TFTs of the organic EL panel of the present invention can be formed as described above, but are not limited to these materials, structures, and formation methods.

Interlayer Insulating Film

The interlayer insulating film may be made of a publicly-known material. Examples of such a material include inorganic materials such as silicon oxide ($SiO_2$), silicon nitride (SiN or $Si_2N_4$), and tantalum oxide (TaO or $Ta_2O_5$) and organic materials such as acrylic resin and resist materials. Examples of a method for forming the interlayer insulating film include dry processes such as a chemical vapor deposition (CVD) method and a vacuum deposition method; and wet processes such as a spin coat method. Further, the interlayer insulating film may be patterned as necessary by a method such as photolithography.

In a case where light from the display section 13 is taken out from the front side of the panel 11 (near side in a depth direction of the paper on which FIG. 1 is illustrated), a light-shielding insulating film which has a light-shielding property is preferably used in order to prevent external light from entering the TFTs formed on the substrate and from causing a change in TFT characteristics.

Further, the insulating film and the light-shielding insulating film may be used in combination. Examples of a material of which the light-shielding insulating film is made include a polymeric resin, such as polyimide, in which a pigment or dye such as phthalocyanine or quinacridone is dispersed; and inorganic insulating materials such as color resist, black matrix material, and $Ni_xZn_yFe_2O_4$. However, the present invention is not limited to these materials and formation methods.

Planarizing Film

The formation of the TFTs etc. on the substrate causes a surface of the substrate to be uneven. This unevenness would cause defects of the display section 13 (e.g., deficiency of a pixel electrode, deficiency of an organic layer provided on the display section 13, disconnection of a counter electrode, short-circuit between the pixel electrode and the counter electrode, a decline in resistance to pressure, etc.). A planarizing film can be provided on the interlayer insulating film in order to prevent such defects.

The planarizing film can be made of a publicly-known material. Examples of such a material include inorganic materials such as silicon oxide, silicon nitride, tantalum oxide; and organic materials such as polyimide, acrylic resin, and a resist material. Examples of a method for forming the planarizing film include dry processes such as a CVD method and a vacuum deposition method; and wet processes such as a spin coat method. Note, however, that the present invention is not limited to these materials and formation methods.

The planarizing film may have a single-layer structure or may have a multi-layer structure.

[Display Section]

A specific configuration of the display section 13 illustrated in FIG. 1 and FIG. 2 are described with reference to FIG. 4 and FIGS. 6 through 11. FIGS. 6, 7, 9, and 10 are diagrams schematically illustrating relationship between a layout of sub-pixels in each pixel and drivers (a gate driver, a source driver, and a power supply circuit). FIG. 11 is a cross-sectional view illustrating a configuration of the display section 13.

As illustrated in FIG. 11, the display section 13 has a rectangular shape, and has a plurality of organic EL elements (light-emitting elements) in each of which a first electrode 20, an organic layer 30 having at least an organic light-emitting layer made of an organic light-emitting material, and a second electrode 21 are laminated in this order on the flat surface 12a' of the substrate 12. The adjacent region 12b (the adjacent surface 12b') adjacent to the flat surface 12a' is provided along one of long sides of the rectangular display section 13. An edge of the other one of the long sides of the display section 13 coincides with an edge of the flat surface 12a', i.e., an edge of the flat surface 12a' which edge is opposite to an edge adjacent to the adjacent surface 12b'. By thus causing these edges to coincide with each other, the panels 11 can be connected to each other so that the display sections 13 become flush with each other, as illustrated in FIG. 4.

In the display section 13, the organic EL elements having red, green, and blue organic light-emitting layers are aligned. This makes it possible to obtain a full-color image. White light emission can be obtained by using an organic EL element in which yellow and blue organic light-emitting layers are laminated or by using an organic EL element in which red, green, and blue organic light-emitting layers are laminated.

Note that other members (not illustrated in FIG. 11) than the first electrode 20, the organic layer 30, and the second electrode 21 may be laminated. Specifically, the organic layer 30 and the second electrode 21 may be laminated after an insulating edge cover for preventing leakage in an edge portion of the first electrode 20 and an insulating separate layer for retaining a functional material solution, which is applied in a case where the organic layer 30 is formed by a wet process, are formed in this order on the first electrode 20.

Pixel Configuration

As described above, the image display device of the present invention can be a simple matrix driving type image display device or can be an active matrix driving type image display device. The present embodiment deals with an active matrix driving type image display device.

As illustrated in FIG. 4, a plurality of pixels 50 are arranged in a matrix in the display section 13. Each of the pixels 50 includes a plurality of sub-pixels (in the present embodiment, a sub-pixel 51R for displaying red, a sub-pixel 51G for displaying green, and a sub-pixel 51B for displaying blue). In the red sub-pixel 51R, an organic EL element having a red organic light-emitting layer is formed. In the green sub-pixel 51G, an organic EL element having a green organic light-emitting layer is formed. In the blue sub-pixel 51B, an organic EL element having a blue organic light-emitting layer is formed.

FIG. 6 is a diagram illustrating an image display device for comparison in which (i) the display section 13 is arranged such that a direction in which sub-pixels in each pixel are aligned and a direction in which scanning signal lines and data signal lines extend are identical to those in a conventional image display device and (ii) a plurality of panels are connected in a vertical direction (column direction of a matrix). Specifically, the sub-pixels 51R, 51G, and the 51B are aligned in each pixel 50 in a row direction of the matrix, as illustrated in (a) and (b) of FIG. 6. The scanning signal lines 56 extend parallel to the row direction of the matrix. The data signal lines 54 and the power supply lines (power supply wires) 55 extend parallel to a column direction of the matrix.

Each of the data signal lines 54 is electrically connected to a source driver 58 in a corresponding one of the H scanners 14. Each of the scanning signal lines 56 is electrically connected to a gate driver 57 in the V scanners 15. According to this arrangement, three data signal lines 54 (corresponding to the respective sub-pixels) are required for each pixel 50.

The data signal lines 54 of each of the panels 11 is connected to the source driver in the H scanner 14 of the panel 11. Accordingly, the number of source drivers necessary for driving of the image display device is n times as many as that of a conventional image display device in which a display section is not divided, provided that n is the number of panels 11.

FIG. 7 is a diagram illustrating an image display device of the present invention in which (i) the display section 13 is arranged such that a direction in which sub-pixels in each pixel are aligned and a direction in which scanning signal lines and data signal lines extend are different from those in a conventional image display device and (ii) a plurality of panels are connected in a vertical direction (column direction of a matrix). Specifically, the sub-pixels 51R, 51G, and the 51B are aligned in each pixel 50 in a column direction of the matrix, as illustrated in (a) through (c) of FIG. 7. That is, in a case where the image display member 10 is produced by connecting the panels 11 in the vertical direction, the sub-pixels are aligned in each pixel in a short side direction of the panels 11. The scanning signal lines 56 extend parallel to the row direction of the matrix, and the data signal lines 54 and the power supply lines 55 extend parallel to the column direction of the matrix (see (b) of FIG. 7). Alternatively, the data signal lines 54 extend parallel to the row direction of the matrix, and the scanning signal lines 56 and the power supply lines 55 extend parallel to the column direction of the matrix (see (c) of FIG. 7).

In the image display member 10 having the arrangement illustrated in (b) of FIG. 7, each of the data signal lines 54 is electrically connected to the source driver 58 in a corresponding one of the H scanners 14, and each of the scanning signal lines 56 is electrically connected to the gate driver 57 in the V scanners 15. According to this arrangement, a single data signal line 54 (corresponding to a single sub-pixel) is required for each pixel 50.

Accordingly, in the image display member 10 having the arrangement illustrated in (b) of FIG. 7, the number of source drivers necessary for driving of the image display device is only ⅓ of that of the image display member 10 for comparison illustrated in FIG. 6. That is, it is possible to reduce the number of required source drivers. Since it is possible to suppress an increase in the number of source drivers which results from use of a plurality of panels, it is possible to suppress an increase in cost.

According to the arrangement illustrated in (b) of FIG. 7, the number of required gate drivers increases as compared with the arrangement illustrated in FIG. 6. However, since a cost of a gate driver is lower than that of a source driver as described later, a reduction in cost can be achieved by reducing the number of source drivers even if the number of gate drivers increases.

Meanwhile, in the image display member 10 having the arrangement illustrated in (c) of FIG. 7, each of the data signal lines 54 is electrically connected to the source driver 58 in a terminal group of a corresponding one of the V scanners 15, and each of the scanning signal lines 56 is electrically connected to the gate driver 57 in a terminal group of a corresponding one of H scanners 14. According to this arrangement, three data signal lines 54 (corresponding to the respective sub-pixels) are required for each pixel 50.

However, the data signal lines 54 of the panels 11 are connected to the source driver in the V scanners 15 of the panels 11. Accordingly, even in a case where the image display member 10 is constituted by a plurality of panels 11, the number of source drivers necessary for driving the image display device is same as that of a conventional image display device in which a display section is not divided.

For example, in a case where the image display device is a high-vision 1920 by 1080 image display device, i.e., in a case where a horizontal to vertical ratio is 16:9, the number of source drivers necessary for driving the image display device is only 9/16n (n is the number of panels) of that of the image display device having the arrangement illustrated in FIG. 6. That is, it is possible to reduce the number of required source drivers. Since it is possible to suppress an increase in the number of source drivers which results from use of a plurality of panels 11, it is possible to suppress an increase in cost.

In the present embodiment, horizontally long panels 11 are connected to each other in a vertical direction. However, the present invention is not limited to this. Another arrangement as illustrated in FIG. 8 is also possible in which vertically long panels 11' are connected to each other in a horizontal direction. The panels 11' are different from the panels 11 in that a terminal group of the V scanner 15 is provided along a long side of the display section 13 of each of the panels 11' and a terminal group of the H scanner 14 is provided along a short side of the display section 13 of each of the panels 11'. As for the other configuration, the explanation for the panels 11 can be referred to. In FIG. 8, driving can be carried out by connecting the H scanner 14 to a conventional source driver provided outside and by connecting the V scanner 15 to a conventional gate driver provided outside. Alternatively, driving can be carried out by connecting the H scanner 14 to a conventional gate driver provided outside and by connecting the V scanner 15 to a conventional source driver provided outside.

FIG. 9 is a diagram illustrating an image display device for comparison in which (i) the display section 13 is arranged such that a direction in which sub-pixels in each pixel are aligned and a direction in which scanning signal lines and data signal lines extend are identical to those in a conventional image display device and (ii) vertically long panels 11' are connected to each other in a horizontal direction. Specifically, the sub-pixels 51R, 51G, and the 51B are aligned in each pixel 50 in a row direction of the matrix as illustrated in (a) and (b) of FIG. 9. The scanning signal lines 56 extend parallel to the row direction of the matrix. The data signal lines 54 and the power supply lines 55 extend parallel to a column direction of the matrix.

Each of the data signal lines 54 is electrically connected to a source driver 58 in the H scanners 14. Each of the scanning signal lines 56 is electrically connected to a gate driver 57 in a corresponding one of the V scanners 15. According to this arrangement, three data signal lines 54 (corresponding to the respective sub-pixels) are required for each pixel 50.

The data signal lines 54 of the panels 11' are connected to the source driver in the H scanner 14 of the panels 11'. Accordingly, even in a case where the image display member 10 is constituted by a plurality of panels 11', the number of source drivers necessary for driving the image display device is same as that of a conventional image display device in which a display section is not divided.

FIG. 10 is a diagram illustrating an image display device in which (i) the display section 13 is arranged such that a direction in which sub-pixels in each pixel are aligned and a direction in which scanning signal lines and data signal lines extend are different from those in a conventional image display device and (ii) a plurality of panels are connected in a horizontal direction. Specifically, the sub-pixels 51R, 51G, and the 51B are aligned in each pixel 50 in a column direction of the matrix as illustrated in (a) and (b) of FIG. 10. That is, in a case where the image display member 10 is constituted by the vertically long panels 11' connected in the horizontal direction, the sub-pixels are aligned in each pixel in a long side direction of each of the panels 11'. The scanning signal lines 56 extend parallel to the row direction of the matrix, and the data signal lines 54 and the power supply lines 55 extend parallel to the column direction of the matrix.

In the image display member 10 having the arrangement illustrated in FIG. 10, each of the data signal lines 54 is electrically connected to the source driver 58 in a terminal group (second terminal group) of the H scanner 14, and each of the scanning signal lines 56 is electrically connected to the gate driver 57 in a terminal group (first terminal group) of the V scanner 15. According to this arrangement, a single data signal line 54 (corresponding to a single sub-pixel) is required for each pixel 50.

Accordingly, in the image display member 10 having the arrangement illustrated in FIG. 10, the number of source driver necessary for driving of the image display device is only ⅓ of that of the image display member 10 for comparison illustrated in FIG. 9. That is, it is possible to reduce the number of required source drivers. Since it is possible to suppress an increase in the number of source drivers which results from use of a plurality of panels, it is possible to suppress an increase in cost.

Organic Layer

The organic layer 30 illustrated in FIG. 11 may be a single-layer structure constituted by an organic light-emitting layer alone or may be a multi-layer structure constituted by the organic light-emitting layer and an electric charge transport layer. Specifically, the organic layer 30 may have, for example, any of the following arrangements 1) through 9).

1) organic light-emitting layer
2) hole transport layer/organic light-emitting layer
3) organic light-emitting layer/electron transport layer
4) hole transport layer/organic light-emitting layer/electron transport layer
5) hole injection layer/hole transport layer/organic light-emitting layer/electron transport layer
6) hole injection layer/hole transport layer/organic light-emitting layer/electron transport layer/electron injection layer
7) hole injection layer/hole transport layer/organic light-emitting layer/hole blocking layer/electron transport layer
8) hole injection layer/hole transport layer/organic light-emitting layer/hole blocking layer/electron transport layer/electron injection layer
9) hole injection layer/hole transport layer/electron blocking layer/organic light-emitting layer/hole blocking layer/electron transport layer/electron injection layer Note, however, that the present invention is not limited to this. Further, each of the organic light-emitting layer, the hole injection layer, the hole transport layer, the hole blocking layer, the electron blocking layer, the electron transport layer, and the electron injection layer may be a single-layer structure or may be a multi-layer structure.

In FIG. 11, the arrangement 8) is employed. Specifically, a hole injection layer 31, a hole transport layer 32, an organic light-emitting layer 33, a hole blocking layer 34, an electron transport layer 35, and an electron injection layer 36 are laminated in this order in a direction from the first electrode 20 towards the second electrode 21.

The organic light-emitting layer 33 may be made of one of the organic light-emitting materials alone which are exemplified below, may be made of a combination of a light-emitting dopant and a host material, may optionally contain a hole transport material, an electron transport material, an additive (e.g., donor, acceptor), or the like, or may be made of a polymer material (binder resin) or an inorganic material in which these materials are dispersed. It is preferable, from the viewpoint of light emission efficiency and light emission lifetime, that the organic light-emitting layer 33 be made of a host material in which a light-emitting dopant is dispersed.

The organic light-emitting material may be a publicly-known light-emitting material for an organic EL display. Such a light-emitting material is classified into a low-molecular light-emitting material, a high-molecular light-emitting material, and the like. Although specific compounds for such a light-emitting material are exemplified below, the present invention is not limited to these materials. Such a light-emitting material can be further classified into a fluorescent material, a phosphorescent material, and the like. It is preferable, from the viewpoint of lower power consumption, that the organic light-emitting layer 33 be made of a phosphorescent material, which is high in light emission efficiency.

Although specific compounds are exemplified below, the present invention is not limited to these materials.

Examples of the low-molecular organic light-emitting material include fluorescent organic materials such as aromatic dimethylidene compounds such as 4,4'-bis(2,2'-diphenylvinyl)-biphenyl (DPVBi), oxadiazole compounds such as 5-methyl-2-[2-[4-(5-methyl-2-benzoxazolyl)phenyl]vinyl] benzoxazole, triazole derivatives such as 3-(4-biphenylyl)-4-phenyl-5-t-butylphenyl-1,2,4-triazole (TAZ), styrylbenzene compounds such as 1,4-bis(2-methylstyryl)benzene, thiopyrazine dioxide derivatives, benzoquinone derivatives, naphthoquinone derivatives, anthraquinone derivatives, diphenoquinone derivatives, and fluorenone derivatives; and fluorescent light-emitting organic metal complexes such as azomethine zinc complexes and (8-hydroxyquinolinato) aluminum complexes ($Alq_3$).

Examples of the high-molecular light-emitting material include polyphenylene vinylene derivatives such as poly(2-decyloxy-1,4-phenylene) (DO-PPP), poly[2,5-bis-[2-(N,N, N-triethylammonium)ethoxy]-1,4-phenyl-alto-1,4-phenylene]dibromide (PPP-Net3+), poly[2-(2'-ethylhexyloxy)-5-methoxy-1,4-phenylene vinylene] (MEH-PPV), poly[5-methoxy-(2-propanoxysulfonide)-1,4-phenylene vinylene] (MPS-PPV), and poly[2,5-bis-(hexyloxy)-1,4-phenylene-(1-cyanovinylene)] (CN-PPV; and polyspiro derivatives such as poly(9,9-dioctylfluorene) (PDAF).

The light-emitting dopant optionally contained in the organic light-emitting layer 33 may be a publicly-known dopant material for an organic EL display. Examples of such a dopant material include fluorescent light-emitting materials such as styryl derivatives, perylene, iridium complexes, coumarin derivatives, Lumogen F Red, dicyanomethylenepyran, phenoxazone, and porphyrin derivatives; and phosphorescent light-emitting organic metal complexes such as bis[(4,6-difluorophenyl)-pyridinato-N, C2']picolinatoiridium (III) (FIrpic), tris(2-phenylpyridyl)iridium (III) ($Ir(ppy)_3$), and tris (1-phenylisoquinoline)iridium (III) ($Ir(piq)_3$).

The host material used in a case where a dopant is used may be a publicly-known host material for an organic EL display. Examples of such a host material include the low-molecular light-emitting materials mentioned above, the high-molecular light-emitting materials mentioned above, and carbazole derivatives such as 4,4'-bis(carbazole)biphenyl and 9,9-di(4-dicarbazole-benzyl)fluorene (CPF).

An electric charge injection/transport layer is classified into an electric charge injection layer (the hole injection layer 31, the electron injection layer 36) and an electric charge transport layer (the hole transport layer 32, the electron transport layer 35) in order to more efficiently perform injection of an electric charge (hole, electron) from an electrode and transport (injection) to the organic light-emitting layer. The electric charge injection/transport layer may be made of one of the electric charge injection/transport materials alone which are exemplified below, may optionally contain an additive (e.g., donor, acceptor), or the like, or may be made of a high-molecular material (binder resin) or an inorganic material in which these materials are dispersed.

The electric charge injection/transport material may be a publicly-known electric charge transport material for an organic EL display or for an organic photoconductor. Such an electric charge injection/transport material is classified into a hole injection/transport material and an electron injection/transport material. Although specific compounds are exemplified below, the present invention is not limited to these materials.

Examples of a hole injection/hole transport material include oxides such as vanadium oxide ($V_2O_5$) and molybdenum oxide ($MoO_2$); inorganic p-type semiconductor material; porphyrin compound; aromatic tertiary amine compounds such as N,N'-bis(3-methylphenyl)-N,N'-bis (phenyl)-benzidine (TPD) and N,N'-di(naphthalene-1-yl)-N,N'-diphenyl-benzidine (NPD); low molecular materials such as hydrazone compounds, quinacridone compounds, and styrylamine compounds; and high-molecular materials such as polyaniline (PANI), polyaniline camphorsulfonic acid (PANI-CSA), 3,4-polyethylene dioxythiophene/polystyrenesulfonate (PEDOT/PSS), poly(triphenylamine) derivatives (Poly-TPD), polyvinylcarbazole (PVCz), poly(p-phenylenevinylene) (PPV), and poly(p-naphthalenevinylene) (PNV).

It is preferable, from the viewpoint of more efficient hole injection/transport from an anode, that a hole injection layer be made of a material that is lower in energy level of highest occupied molecular orbital (HOMO) than a hole injection/transport material used for a hole transport layer, and that the hole transport layer be made of a material that is higher in hole mobility than the hole injection/transport material used for the hole injection layer.

In order to further improve hole injection/transport efficiency, it is preferable that the hole injection/transport material be doped with an acceptor. The acceptor may be made of a publicly-known acceptor material for an organic EL display. Although specific compounds are exemplified below, the present invention is not limited to these materials.

Examples of the acceptor material include inorganic materials such as Au, Pt, W, Ir, $POCl_3$, $AsF_6$, Cl, Br, I, vanadium oxide ($V_2O_5$), and molybdenum oxide ($MoO_2$); compounds having a cyano group such as TCNQ (7,7,8,8,-tetracyanoquinodimethane), $TCNQF_4$ (tetrafluorotetracyanoquinodimethane), TCNE (tetracyanoethylene), HCNB (hexacyanobutadiene), and DDQ (dicyclodicyanobenzoquinone); compounds having a nitro group such as TNF (trinitrofluorenone) and DNF (dinitrofluorenone); and organic materials such as fluoranil, chloranil, and bromanil. Above all, the compounds having a cyano group such as TCNQ, $TCNQF_4$, TCNE, HCNB, and DDQ are more preferable since such compounds having a cyano group make it possible to more effectively increase carrier concentration.

Examples of the electron injection material and the electron transport material include inorganic materials which are n-type semiconductors; low-molecular materials such as oxadiazole derivatives, triazole derivatives, thiopyrazine dioxide derivatives, benzoquinone derivatives, naphthoquinone derivatives, anthraquinone derivatives, diphenoquinone derivatives, fluorenone derivatives, and benzodifuran derivatives; high-molecular materials such as poly(oxadiazole)

(Poly-OXZ) and polystyrene derivatives (PSS). In particular, examples of the electron injection material include fluoride such as lithium fluoride (LiF) and barium fluoride ($BaF_2$); and oxides such as lithium oxide ($Li_2O$).

It is preferable, from the viewpoint of more efficient electron injection/transport from a cathode, that the electron injection layer 36 be made of a material that is higher in energy level of lowest unoccupied molecular orbital (LUMO) than an electron injection/transport material used for the electron transport layer 35, and that the electron transport layer 35 be made of a material that is higher in electron mobility than the electron injection/transport material used for the electron injection layer 36.

In order to further improve electron injection/transport efficiency, it is preferable that the electron injection/transport material be doped with a donor. The donor may be made of a publicly-known donor material for an organic EL display. Although specific compounds are exemplified below, the present invention is not limited to these materials.

Examples of the donor material include inorganic materials such as alkali metals, alkaline earth metals, rare earth elements, Al, Ag, Cu, and In; compounds having an aromatic tertiary amine in their skeletons, such as anilines, phenylenediamines, benzidines (N,N,N',N'-tetraphenylbenzidine, N,N'-bis-(3-methylphenyl)-N,N'-bis-(phenyl)-benzidine, N,N'-di(naphthalene-1-yl)-N,N'-diphenyl-benzidine, etc.), triphenylamines (triphenylamine, 4,4',4"-tris(N,N-diphenyl-amino)-triphenylamine, 4,4',4"-tris(N-3-methylphenyl-N-phenyl-amino)-triphenylamine, 4,4',4"-tris(N-(1-naphthyl)-N-phenyl-amino)-triphenylamine, etc.), and triphenyldiamines (N,N'-di-(4-methyl-phenyl)-N,N'-diphe-nyl-1,4-phenylenediamine); condensed polycyclic compounds (note, however, that the condensed polycyclic compounds may have a substituent group) such as phenanthrene, pyrene, perylene, anthracene, tetracene, and pentacene; and organic materials such as TTFs (tetrathiafulvalenes), dibenzofuran, phenothiazine, and carbazole. Above all, especially the compounds having an aromatic tertiary amine in their skeletons, the condensed polycyclic compounds, and the alkali metals are more preferable since these materials make it possible to more effectively increase carrier concentration.

The organic layer 30 constituted by the hole injection layer 31, the hole transport layer 32, the organic light-emitting layer 33, the hole blocking layer 34, the electron transport layer 35, and the electron injection layer 36 can be formed with the use of a coating solution for organic layer formation in which any of the materials is dissolved and dispersed, by using a publicly-known wet process such as a coating method such as a spin coating method, a dipping method, a doctor blade method, an ejection coat method, or a spray coat method; or a printing method such as an ink jet method, a relief printing method, an intaglio printing method, a screen printing method, or a microgravure coat method. Alternatively, the organic layer 30 can be formed with the use of any of the above materials, by using a publicly-known dry process such as a resistive heating deposition method, an electron-beam (EB) deposition method, a molecular beam epitaxy (MBE) method, a sputtering method, or an organic vapor phase deposition (OVPD) method; or a laser transfer method. Note that in a case where the organic layer 30 is formed by using a wet process, the coating solution for organic layer formation may contain an additive, such as a leveling agent or a viscosity modifier, for adjusting a physical property of the coating solution.

In Example 1 described later, the organic layer 30 is formed by using a resistive heating deposition method, which is one of the dry processes, in accordance with an in-line system.

FIG. 12 is a diagram explaining how the organic layer 30 is formed by using an in-line resistive heating deposition device. As illustrated in FIG. 12, a coating solution is applied from a deposition source 40, in which a coating solution for organic layer formation is stored, to the substrate 12 on which the first electrode 20 is formed. In this case, a shadow mask 41 for masking an undesired region is disposed between the substrate 12 and the deposition source 40 so that the coating solution is applied only to a desired region. The coating process proceeds while the substrate 12 is being moved by a substrate holder (not illustrated) in a direction indicated by the arrow A in FIG. 12. The movement allows the organic layer 30 to be formed on the rectangular first electrode 20 formed on the flat surface 12a' of the substrate 12 so that the organic layer 30 has a rectangular shape of the same size as the first electrode 20. In FIG. 12, the substrate 12 (the substrate holder) is moved. However, the present invention is not limited to this. Instead of moving the substrate 12, the deposition source 40 and the shadow mask 41 may be moved over the substrate 12.

The organic layer 30 generally has a thickness of approximately 1 nm to 1000 nm, but preferably has a thickness of 10 nm to 200 nm. In a case where the organic layer 30 has a thickness of less than 10 nm, it is difficult to obtain originally required physical properties (electric charge injection property, transport property, confinement property). Moreover, a pixel defect would occur due to a foreign substance such as dust. Meanwhile, in a case where the organic layer 30 has a thickness of more than 200 nm, a driving voltage rises due to a resistive component of the organic layer 30. This leads to an increase in power consumption.

First Electrode and Second Electrode

The first electrode 20 and the second electrode 21 illustrated in FIG. 11 functions in a pair as an anode and a cathode of an organic EL element, respectively, and vice versa. That is, in a case where the first electrode 20 is an anode, the second electrode 21 is a cathode, whereas in a case where the first electrode 20 is a cathode, the second electrode 21 is an anode. Although specific compounds and formation methods are exemplified below, the present invention is not limited to these materials and formation methods.

An electrode material of which the first electrode 20 and the second electrode 21 are made may be a publicly-known electrode material. Examples of a transparent electrode material for an anode include metals such as gold (Au), platinum (Pt), and nickel (Ni); and metal oxides such as an oxide (ITO) made of indium (In) and tin (Sn), an oxide ($SnO_2$) made of tin (Sn), and an oxide (IZO) made of indium (In) and zinc (Zn), each of which has a work function of 4.5 eV or more from the viewpoint of more efficient hole injection to the organic light-emitting layer 33. Examples of an electrode material for a cathode include metals such as lithium (Li), calcium (Ca), cerium (Ce), barium (Ba), and aluminum (Al); and alloys containing these metals, such as a Mg:Ag alloy and a Li:Al alloy, each of which has a work function of 4.5 eV or less from the viewpoint of more efficient electron injection to the organic light-emitting layer 33.

The first electrode 20 and the second electrode 21 can be formed with the use of the above materials by a publicly-known method such as an EB deposition method, a sputtering method, an ion plating method, or a resistive heating deposition method. However, the present invention is not limited to these formation methods. The electrodes thus formed may be patterned as necessary by photolithography or laser ablation. Further, by combining the photolithography or laser ablation with a shadow mask, patterned electrodes can be directly formed. The first electrode 20 and the second electrode 21 preferably have a thickness of 50 nm or more. In a case where the first electrode 20 and the second electrode 21 have a thickness of less than 50 nm, a rise in driving voltage would occur due to a rise in wiring resistance.

In a case where light from the organic light-emitting layer 33 is taken out from a front surface side (the near side in the depth direction of the paper on which FIG. 1 is illustrated) of the display section 13 (see FIG. 1 and FIG. 2), the second electrode 21 is preferably a transparent electrode or a semi-transparent electrode. Meanwhile, in a case where light from the organic light-emitting layer 33 is taken out from the rear surface side (the far side in the depth direction of the paper on which FIG. 1 is illustrated) of the panel 11, the first electrode 20 is preferably a transparent electrode or a semi-transparent electrode.

The transparent electrode material is especially preferably ITO or IZO. The transparent electrode has a thickness preferably in a range from 50 nm to 500 nm, more preferably in a range from 100 nm to 300 nm. In a case where the transparent electrode has a thickness of less than 50 nm, a rise in driving voltage would occur due to a rise in wiring resistance. Meanwhile, in a case where the transparent electrode has a thickness of more than 500 nm, a decline in luminance would occur due to a decline in light transmittance.

In a case where a microcavity (interference) effect is used for the purpose of improvement of color purity, improvement of light emission efficiency, etc. and where light from the organic light-emitting layer is taken out from the first electrode 20 side (the second electrode 21 side), the first electrode 20 (the second electrode 21) is preferably a semi-transparent electrode. The semi-transparent electrode material may be a metal semi-transparent electrode alone or a combination of a metal semi-transparent electrode and a transparent electrode material. From the viewpoint of reflectance and transmittance, the semi-transparent electrode material is preferably silver. The semi-transparent electrode preferably has a thickness in a range from 5 nm to 30 nm. In a case where the semi-transparent electrode has a thickness of less than 5 nm, the interference effect cannot be sufficiently obtained since light is not sufficiently reflected. Meanwhile, in a case where the semi-transparent electrode has a thickness of more than 30 nm, a decline in luminance and efficiency would occur due to a rapid decline in light transmittance.

In a case where light from the organic light-emitting layer is taken out from the first electrode 20 (the second electrode 21), the second electrode 21 (the first electrode 20) is preferably an electrode which does not transmit light. Examples of an electrode material of which such an electrode which does not transmit light is made include black electrodes such as tantalum and carbon; reflective metal electrodes such as aluminum, silver, gold, an aluminum-lithium alloy, an aluminum-neodymium alloy, and an aluminum-silicon alloy; and combinations of an transparent electrode and any one of the reflective metal electrodes (reflective electrodes).

Edge Cover

An edge cover for preventing leakage between the first electrode 20 and the second electrode 21 may be provided in an edge portion of the first electrode 20.

The following describes a configuration and effects of the edge cover with reference to FIG. 13 and FIG. 14. FIG. 13 is a cross-sectional view illustrating a cross-section of a state in which the edge cover is provided. FIG. 14 is a diagram for comparison with FIG. 13, and is a cross-sectional view illustrating a cross-section of a state in which no edge cover is provided. As illustrated in FIG. 13, an edge cover 28 is provided in an edge portion of the first electrode 20. In a case where no edge cover is provided, the organic layer 30 becomes thin as illustrated in FIG. 14. This causes leakage between the first electrode 20 and the second electrode 21. The edge cover 28 can effectively prevent such a leakage.

The edge cover may be formed with the use of an insulating material by a publicly-known method such as an EB deposition method, a sputtering method, an ion plating method, or a resistive heating deposition method. Further, the edge cover may be patterned by a publicly-known dry or wet photolithography method. Note, however, that the present invention is not limited to these formation methods.

The insulating material may be a publicly-known material. Although the present invention is not limited in particular, the insulating material needs to transmit light, and can be, for example, SiO, SiON, SiN, SiOC, SiC, HfSiON, ZrO, HfO, LaO, or the like.

The edge cover preferably has a thickness in a range from 100 nm to 2000 nm. In a case where the edge cover has a thickness of 100 nm or less, a sufficient insulating property cannot be obtained. This causes leakage between the first electrode and the second electrode, thereby causing an increase in power consumption and non light emission. Meanwhile, in a case where the edge cover has a thickness of 2000 nm or more, it takes time to form the edge cover. This causes a deterioration in productivity and disconnection of the second electrode 21 in the edge cover.

Sealing Film and Sealing Substrate

A sealing substrate or a sealing film (not illustrated) for sealing, which is made of a material such as glass or plastic, may be further provided on the second electrode 21, which is a top surface, via an inorganic film or a resin film.

The sealing substrate and the sealing film may be formed with the use of a publicly-known sealing material by using a publicly-known sealing method. Specifically, the sealing substrate and the sealing film may be formed, for example, by a method of sealing an inert gas such as a nitrogen gas or an argon gas by glass, metal, or the like. Preferably, a desiccant such as barium oxide is further mixed in the inert gas thus sealed since it is possible to more effectively reduce deterioration of an organic EL element caused by moisture. Alternatively, the sealing film may be formed by applying or bonding a resin on the second electrode 21 by using a spin coat method, ODF, or a laminate method. Alternatively, the sealing film may be formed by forming an inorganic film made of a material such as SiO, SiON or SiN on the second electrode 21 by a method such as a plasma CVD method, an ion plating method, an ion beam method, or a sputtering method and then further applying or bonding a resin by using a spin coat method, ODF, or a laminate method. The sealing film can prevent oxygen and moisture from entering an inside of an element from an outside. This increases a lifetime of the organic EL element. Note that the present invention is not limited to these members and the formation methods. In a case where light from the organic layer 30 is taken out from the second electrode side, i.e., the front surface side (the near-side in the depth direction of the paper on which FIG. 1 is illustrated) of the panel 11, both of the sealing film and the sealing substrate needs to be made of a light-transmissive material.

Note that the sealing substrate is not necessarily needed. The sealing may be accomplished only by the inorganic film and the resin film.

Polarizing Plate

A polarizing plate may be further provided in the display section 13 on a side from which light from the organic light-emitting layer (the organic layer 30) is taken out.

The polarizing plate may be a combination of a linear polarization plate and a $\lambda/4$ plate. The polarizing plate makes it possible to prevent reflection of external light from various wirings and electrodes and reflection of external light on a surface of the substrate or the sealing substrate. This allows an improvement in contrast of the image display device.

[H Scanner]

The H scanner 14 illustrated in FIGS. 1 and 2 is a horizontal scan. The H scanner 14 is formed on the adjacent surface 12b' of the substrate 12 of each panel 11, and extends along one of long sides of the rectangular display section 13 so as to have a same or substantially same length as the long side.

In the H scanner 14, a terminal group provided along the long side of the display section 13 of each panel 11 is aligned in a horizontal direction. The terminal groups in the H scanners of the respective panels 11 are connected to each other.

[V Scanner]

The V scanner 15 illustrated in FIGS. 1 and 2 is a vertical scan. The V scanner 15 is formed on the flat surface 12a' of the substrate 12 of each panel 11, and extends along one of short sides of the rectangular display section 13 so as to have a same or substantially same length as the short side.

In the V scanner 15, a terminal group provided along the short side of the display section 13 of each panel 11 is aligned in a vertical direction. The terminal groups in the V scanners of the respective panels 11 are connected to each other.

[Driving Circuit]

The image display device of the present invention is driven mainly according to dot sequential driving or line sequential driving, as with a normal liquid crystal display (liquid crystal display device). (a) and (b) of FIG. 20 are diagrams illustrating configurations of source drivers for the respective driving methods.

The dot sequential driving is, for example, a method in which analog video signals serially inputted are sequentially sampled over a horizontal scanning period and a signal voltage is applied to a corresponding data signal line 54. A circuit for the dot sequential driving includes a shift register 61. Meanwhile, the line sequential driving is, for example, a method in which digital video signals serially inputted are subjected to serial-parallel conversion, are latched, are then subjected to digital-analog conversion, and signal voltages are applied to corresponding data signal lines 54 all at once. Accordingly, a circuit for line sequential driving includes a sampling latch 62 and a digital-analog converter (DAC) 63 in addition to the shift register 61.

Generally, since the line sequential driving allows a writing time into each display pixel to be uniform and long, a source driver for line sequential driving is currently widely used.

In contrast, a gate driver is constituted almost only by a shift register. Accordingly, the gate driver is half or less than half the price of the source driver for line sequential driving. Consequently, reduction in the number of source drivers produces a higher cost reducing effect than reduction in the number of gate drivers.

In a case where the scanning signal lines 56 extend in a long side direction of the panels 11, a data writing time in each of the panels 11 is made sufficiently long by simultaneously driving the panels 11. For example, in a case where the number of panels 11 constituting the image display device is n, the writing time is n times that of a conventional one. Accordingly, even in a case where the source driver is driven according to the dot sequential driving, the writing time can be sufficiently secured. In this case, a driver for dot sequential driving which is less expensive than a driver for line sequential driving can be used as a source driver. This allows for a further reduction in cost.

In a case where a TFT is one using an amorphous oxide semiconductor such as μc-Si (microcrystalline silicon) or InGaZnO (IGZO) semiconductor, the dot sequential driving driver can be formed on a TFT substrate. This allows for a further reduction in cost.

[3] Connection of Panels

The image display member 10 illustrated in FIG. 1 is produced by connecting the desired number (three in FIG. 1) of panels 11 each having the above configuration.

Each of the panels 11 preferably has an alignment member for alignment for the purpose of preventing misalignment of pixels from occurring when the panels 11 are connected to each other.

(a) through (d) of FIG. 15 are diagrams explaining how the panels 11 are connected to each other. As illustrated in (a) of FIG. 15, each of the panels 11 has an alignment member 16 on a surface of the substrate 12.

The alignment member 16 is formed within the flat surface 12a', which is the region 12a in which the display section 13 is formed, and outside the display section 13 and the V scanner 15. In (a) of FIG. 15, four alignment members 16 are provided: two of the four alignment members 16 being provided in a boundary part between the flat surface 12a' and the adjacent surface 12b' so as to sandwich the display section 13, and the other two of the four alignment members 16 being provided in regions on an opposite side to the adjacent surface 12b' so as to sandwich the display section 13.

Note that positions of the alignment members 16 are not limited to the flat surface 12a'. The alignment members 16 may be provided on a rear surface of the panel 11 (the substrate 12), i.e., a surface opposite to the flat surface 12a'. For example, the panels 11 can be precisely connected to each other as illustrated in (d) of FIG. 15 by inserting convex alignment members 16 provided in the boundary part between the flat surface 12a' and the adjacent surface 12b' into concave alignment members 16 provided on the rear surface of the panel 11 (the substrate 12) in edge portions opposite to the adjacent surface 12b'. The concave alignment members 16 may be cutouts formed in the downward direction of the paper on which FIG. 15 is illustrated, like the alignment members 16 illustrated in (a) of FIG. 15 which are provided in edge portions opposite to the adjacent surface 12b'.

Note that the alignment members 16 are not limited to those mentioned above. The alignment may be accomplished with the use of a marker drawn on the panel 11 or the like or may be accomplished with the use of a member prepared separately from the panel 11.

One of specific methods for connecting the panels 11 is a method of connecting the panels 11 by linking the long sides of the panels 11 as illustrated in (c) and (d) of FIG. 15. In this way, the panels 11 can be connected to each other. The connection may be accomplished with the use of an adhesive or the like. However, the present invention is not limited to this. For example, the panels can be precisely connected to each other without the use of an adhesive by inserting/fixing convex alignment members into concave alignment members as described above. In a case where the panels are connected to each other via flexible members (plastic, metal, or the like) so that the panels can be freely folded, it becomes easy to carry the panels from one place into another, carry the panels out of one place to another, and install the panels, after installing the panels once.

As illustrated in (d) of FIG. 15, the panels 11 thus connected to each other are arranged such that the adjacent region 12b of the substrate 12 of one panel 11 protrudes behind a rear surface of the substrate 12 of another panel 11 (panel 11 adjacently connected to the one panel 11) so that the adjacent surface 12b' of the one panel 11 faces the rear surface of the another panel 11. That is, when the panels 11 thus connected are viewed from above, the panels 11 are arranged such that the adjacent surface 12b' facing upwards protrudes behind the rear surface of the substrate 12, as illustrated in (b) of FIG. 15.

In a case where the panels 11 are connected to each other as described above, there occur differences in height among the display sections 13 of the panels 11 as illustrated in (d) of FIG. 15. This causes an adverse effect on display quality. In view of this, in the present embodiment, optical adjustment substrates 17a and 17b for filling the differences in height are provided. In the connection state illustrated in (d) of FIG. 15, the display section 13 of the second panel 11 from the top is positioned backwards from the display section 13 of the top panel 11. This difference in height between these display sections 13 is eliminated by disposing the optical adjustment substrate 17a having the same thickness as the difference on the surface of the display section 13 of the second panel 11. Further, in (d) of FIG. 15, the display section 13 of the third panel 11 from the top is positioned further backwards from the display section 13 of the second panel 11. Accordingly, there occurs a larger difference in height between the display section 13 of the top panel 11 and the display section 13 of the third panel 11 from the top than that between the display section 13 of the top panel 11 and the display section 13 of the second panel 11 from the top. In the present embodiment, the difference in height is filled by disposing the optical adjustment substrate 17b that is thicker than the optical adjustment substrate 17a formed on the surface of the display section 13 of the second panel 11 and that has the same thickness as this larger difference, as illustrated in (d) of FIG. 15. By thus disposing the optical adjustment substrates 17a and 17b, it is possible to cause the image display member 10 to have a flat display surface.

Note that the way in which the panels 11 are connected to each other is not limited to that illustrated in (c) and (d) of FIG. 15. For example, a method of putting the panels 11 into a frame 18 for alignment as illustrated in FIG. 16 may be employed. The frame 18 is prepared to suit the thickness of the image display member 10. By putting the panels 11 into the frame 18, it is possible to increase strength of the image display member obtained by combining the panels 11. This is very advantageous as a product.

Further, it is preferable that the panels 11 be connected to each other with the use of a flexible base member. Especially in a case where the panels 11 are connected in this way, the substrates 12 themselves of the panels 11 are preferably made of a flexible substrate material as illustrated in FIG. 17. With the arrangement, the adjacent region 12b can be bent anytime. Accordingly, it becomes very easy to carry the panels 11. In such a case where the panels 11 each having the substrate 12 made of a flexible substrate material are connected to each other, the panels 11 can be connected to each other, for example, by bonding (i) an edge portion of the flat surface 12a of one panel 11 (substrate 12) which edge portion is opposite to the adjacent surface 12b' and is an edge portion of a rear surface of the panel 11 and (ii) the adjacent surface 12b' of another panel 11 (see the broken circles in (d) of FIG. 17).

Further, in a case where the substrates 12 themselves are made of a flexible material as described above, it becomes unnecessary to separately prepare a flexible base member. This allows a reduction in the number of components, thereby reducing cost. However, the present invention is not limited to these.

[4] Driving Speed

For example, in an image display device having the arrangement illustrated in (b) of FIG. 7, i.e., in an image display device which includes the image display member 10 in which (i) a plurality of panels 11 are connected in a vertical direction, (ii) in each of the panels 11, the sub-pixels 51R, 51G, and 51B are aligned in each pixel 50 in a short side direction of the panel 11, and (iii) a terminal drawn out from each light-emitting element is connected to a source driver 58 provided along a log side of the panel 11, data corresponding to only a single color out of RGB is written in a state in which a single scanning signal line 56 is selected. This makes it necessary to increase scanning speed three times in order to write data corresponding to 1 pixel (corresponding to three RGB sub-pixels) within a conventional scanning time. Accordingly, it is necessary to drive the source driver at triple speed.

However, even in a case where the panels 11 are concurrently driven so that a plurality of scanning signal lines 56 are concurrently selected, different data signals can be supplied to the respective scanning signal lines, provided that (i) the image display member 10 is divided into a plurality of panels 11 in a direction parallel with the scanning signal lines 56 and (ii) terminals of the H scanners 14 in the adjacent surfaces of the respective panels 11 are connected to different source drivers. Accordingly, in a case where the number of panels 11 constituting the image display member 10 is n, a period of time for input of signals corresponding to 1 screen of the image display device is given to 1/n of the whole region of the image display section. Consequently, the driving speed of the source driver can be reduced to 1/n.

Meanwhile, in a case where the image display device is driven at a speed same as the conventional driving speed instead of reducing the driving speed to 1/n, so-called n-fold speed drive becomes possible.

(Effect of Configuration of Present Embodiment)

As described above, according to the configuration of the present embodiment, a terminal group extending from an electrode of organic electroluminescence elements aligned in a long side direction (longitudinal direction) of the rectangular display section 13 can be drawn out to the adjacent surface 12b' so as to be connected to a driving circuit in the adjacent surface 12b'.

With the configuration in which the driving circuit is thus disposed, the panels 11 can be connected (linked) with each other so that no spacing exist between the display section 13 of one panel 11 and the display section 13 of another panel 11. This is because the adjacent surface 12b' of one panel 11 in which the driving circuit is provided is warped and protrude towards a rear surface side of the substrate 12, in the vicinity of a joint (a boundary in a connection section) between the display section 13 of the one panel 11 and the display section 13 of another panel 11.

With the configuration, it is impossible for an observer who observes the display section 13 to observe the adjacent surface 12b', for example, through the joint between the panels 11. The observer can see a highly-precise image displayed on a single large display surface produced by linking the display sections 13 of the respective panels 11 with no space therebetween.

Further, according to the configuration of the present embodiment, the number of panels to be connected to each other is not restricted since the panels 11 are connected to each other so that the adjacent surface 12b' of each panel 11 protrudes towards a rear surface side of another panel 11. Consequently, a desired large screen display surface can be formed.

Further, unlike the conventional configuration, each of the panels 11 to be combined can be reduced in size to a desired area. Since a reduction in size is possible, it is possible to provide a panel that can be reduced in cost.

According to the configuration of the present invention, the display section 13 has a rectangular shape. This makes it possible to, in a process for forming the organic EL elements, (i) easily perform mask processing for formation of a color pattern by a mask deposition method using a conventional shadow mask, (ii) easily achieve high mask alignment accuracy, and (iii) eliminate a risk of misalignment caused by flexure of the mask.

Further, since a size of a display screen can be increased even with the use of a small-sized panel manufacturing device, it is possible to reduce a manufacturing cost. Accordingly, use of a light-emitting panel device of the present invention makes it possible to provide a low-cost large-sized organic EL image display device.

According to the present invention, the panels are connected to each other by linking one panel to a long side of another panel, as described above. This makes it possible to produce a large-sized organic EL image display device with the use of the smaller number of panels 11 as compared with a case where the panels are connected to each other by linking one panel to a short side of another panel, provided that the panels 11 are same in width (length of a short side of the display section 13). Specifically, assume that a 65-inch high-vision television that is 1400 mm in horizontal length (long side of a final product) and 800 mm in vertical length (short side of the final product) is produced. The following discusses (i) a case where panels 11 each having a width of 100 mm are combined in a short side direction of the final product and (ii) a case where the panels 11 each having a width of 100 mm are combined in a long side direction of the final product. In a case where the panels 11 are combined in the short side direction of the final product in the image display device of the present embodiment, each of the panels 11 has a size of 1400 mm×100 mm. As such, the final product can be obtained by combining eight panels 11. Meanwhile, in a case where the panels 11 are combined in the long side direction of the final product, each of the panels 11 has a size of 800 mm×100 mm. As such, fourteen panels are required in order to obtain the final product. Consequently, according to the present invention, a large-sized light-emitting panel device can be produced with the small number of connection sections.

Further, since a direction in which sub-pixels are aligned and connecting locations of the drivers are different from those of a conventional image display device, it is possible to reduce the number of drivers, especially the number of source drivers, which is more expensive.

(Modification of Present Embodiment)

The present embodiment has discusses an image display device obtained by connecting the panels 11 each having the display section 13. However, the present invention is not limited to this. The present invention is also applicable to an illumination device obtained by connecting panels each having a light-emitting section for merely controlling light emission/non-emission (an organic EL illumination device in a case where organic EL elements are provided in the light-emitting section) instead of the display section 13 for displaying an image. That is, the present invention encompasses devices for any applications, provided that the devices are ones obtained by connecting a plurality of panels each of which includes a rectangular light-emitting section in which a plurality of light-emitting elements for controlling light emission as a result of electric current supply or voltage application are provided. In a case where it is only necessary to drive an entire surface of the light-emitting section as in an organic EL illumination device, the driving can be carried out by directly electrically connecting terminal groups provided along long sides of the light-emitting sections of the panels and then connecting the terminal groups provided along the long sides and terminals provided along short sides to an external power supply circuit. Alternatively, driving can be carried out by connecting the terminals provided along the long sides of the panels and the terminals provided along the short sides of the panels directly to an external power supply circuit.

In the present embodiment, organic EL elements are used as the display section 13. However, the present invention is not limited to this. Any light-emitting elements which have a first electrode and a second electrode and which emit light as a result of electric current supply or voltage application can be used instead of the organic EL elements. Specifically, examples of such light-emitting elements include inorganic EL elements, inorganic LEDs, and the like.

In the present embodiment, the adjacent surface 12b' of the substrate 12 has a curved structure. However, the present invention is not limited to this. For example, FIG. 18 is a partial perspective view illustrating another form of the adjacent surface 12b'. As illustrated in FIG. 18, the adjacent surface 12b' may be formed by bending the substrate 12.

Finally, the image display device of the present embodiment is described in more detail with reference to Examples. Note, however, that the present invention is not limited to these examples.

EXAMPLES

Example 1

Image Display Device

A simple matrix driving organic EL image display device in which RGB sub-pixels are aligned in a short side direction of a panel was produced by the following procedure.

A plastic substrate which had a thickness of 0.2 mm and a surface area of 500×220 mm$^2$ and which was coated with a silicon oxide having a thickness of 200 nm was used as the substrate 12 (FIG. 2).

On the surface of the plastic substrate 12, indium-tin oxide (ITO) was deposited by sputtering so that surface resistance became 10Ω/□. This formed a transparent electrode (anode) having a thickness of 200 nm which served as the first electrode 20.

Next, only a region of 492×220 mm$^2$ out of the surface having the area of 500×220 mm$^2$ was patterned by photolithography. This formed the first electrode 20 (FIG. 11) patterned into a stripe having a length of 250 mm and a width of 1 mm.

Next, SiO$_2$ was laminated by sputtering to a thickness of approximately 200 nm in order to form an edge cover in an edge portion of the first electrode 20. SiO$_2$ thus laminated was patterned by photolithography so that only the edge portion of the first electrode 20 is covered by SiO$_2$. In the present Example, only 10 μm portions from edges of four sides of the elongate first electrode 20 were covered by SiO$_2$.

Subsequently, the plastic substrate 12 was washed with water, and was then subjected to 10-minute pure water ultrasonic cleaning, 10-minute acetone ultrasonic cleaning, and 5-minute isopropyl alcohol steam cleaning in this order. Thereafter, the plastic substrate 12 was dried for 1 hour at 100° C.

The display section 13 formed on the 500×220 mm$^2$ substrate 12 was designed to have a size of 492×200 mm$^2$. A sealing area having a width of 2 mm was provided along upper, lower, left, and right edges of the display section 13. Further, a terminal draw-out region (a region in which the V scanner 15 is provided in FIG. 2) having a width of 2 mm was provided outside the sealing area so as to be extend along one of short sides of the rectangular display section 13. Further, a terminal draw-out region (adjacent surface) having a width of 2 mm was provided, as a curved region (adjacent region), along one of long sides of the rectangular display section 13.

Next, the substrate 12, thus obtained through the above steps, on which the first electrode 20 was formed was fixed on a substrate holder in the in-line resistive heating deposition device illustrated in FIG. 12, and then pressure was reduced to vacuum of $1 \times 10^{-4}$ Pa or less. The present Example adopted a method of forming RGB light-emitting pixels by using color patterning utilizing a mask deposition method using a shadow mask 41.

Subsequently, the hole injection layer 31 (FIG. 11) made of 1,1-bis-di-4-tolylamino-phenyl-cyclohexane (TAPC) as a hole injection material was formed in a desired region by a resistive heating deposition method so as to have a thickness of 100 nm.

Next, the hole transport layer 32 (FIG. 11) made of N,N'-di-1-naphthyl-N,N'-diphenyl-1,1'-biphenyl-1,1'-biphenyl-4,4'-diamine (NPD) as a hole transport material was formed by a resistive heating deposition method so as to have a thickness of 40 nm.

Next, a red organic light-emitting layer (thickness: 30 nm) was formed on a desired red light-emitting pixel formed on the hole transport layer 32 by mask color patterning using the shadow mask 41. The red organic light-emitting layer was produced by co-deposition of depositing (i) 3-phenyl-4(1'-naphthyl)-5-phenyl-1,2,4-triazole (TAZ) (host material) and (ii) bis(2-(2'-benzo[4,5-alpha]thienyl)pyridinato-N,C3')iridium(acetylacetonate) ($btp_2Ir$ (acac)) (red phosphorescent light-emitting dopant) at deposition speed of 1.4 Å/second and 0.15 Å/second, respectively.

Next, a green organic light-emitting layer (thickness: 30 nm) was formed on a desired green light-emitting pixel formed on the hole transport layer 32 by mask color patterning using the shadow mask 41. The green organic light-emitting layer was produced by co-deposition of depositing (i) TAZ (host material) and (ii) tris(2-phenylpyridine)iridium (III) ($Ir(ppy)_3$) (green phosphorescent light-emitting dopant) at deposition speed of 1.5 Å/second and 0.2 Å/second, respectively.

Next, a blue organic light-emitting layer (thickness: 30 nm) was formed on a desired blue light-emitting pixel formed on the hole transport layer 32 by mask color patterning using the shadow mask 41. The green organic light-emitting layer was produced by co-deposition of depositing (i) 1,4-bis-triphenylsilyl-benzene (UGH-2) (host material) and (ii) bis[(4,6-difluorophenyl)-pyridinate-N, C2']picolinate Iridium (III) (FIrpic) (blue phosphorescent light-emitting dopant) at deposition speed of 1.5 Å/second and 0.2 Å/second, respectively.

Next, the hole blocking layer 34 (FIG. 11) made of 2,9-dimethyl-4,7-diphenyl-1,10-phenanthroline (BCP) was formed to a thickness of 10 nm on the organic light-emitting layer 33 (FIG. 11) thus formed.

Next, the electron transport layer 35 made of tris(8-hydroxyquinoline)aluminum ($Alq_3$) was formed on the hole blocking layer 34 so as to have a thickness of 30 nm.

Next, the electron injection layer 36 made of lithium fluoride (LiF) was formed on the electron transport layer 35 so as to have a thickness of 1 nm.

Thereafter, the second electrode 21 (FIG. 11) was formed. First, the substrate 12 (on which the first electrode 20 and the organic layer 30 was formed) was fixed in a metal deposition chamber. Next, a shadow mask for formation of the second electrode (a mask having an opening so that the second electrode can be formed in a striped shape having a width of 1 mm and having a longitudinal direction that is perpendicular to a longitudinal direction of the stripe of the first electrode 20) was aligned with the substrate 12 fixed in the metal deposition chamber. Then, aluminum was formed in a desired pattern on a surface of the electron injection layer 36 by a vacuum deposition method. This formed the second electrode 21 having a thickness of 200 nm.

Subsequently, an inorganic protective layer made of $SiO_2$ was formed to a thickness of 1 μm by sputtering in the sealing area, which is a 2 mm portion provided along the upper, lower, left and right edges of the display section 13, while being patterned with the use of a shadow mask. On the inorganic protective layer, a parylene film having a thickness of 2 μm was formed by vapor deposition polymerization. The formation of $SiO_2$ and parylene was repeated five times. Thus, a laminated film of five layers was formed as a sealing film. In this way, the panel 11 illustrated in FIG. 2 was completed.

Next, after alignment using markers which served as the alignment members 16 provided outside the display section 13 along short sides, the three panels 11 thus produced were connected to each other so that long sides of the panels 11 are located side by side in a vertical direction as illustrated in (c) and (d) of FIG. 15.

Note that the adjacent region 12b provided along a long side was bent before the panels are connected to each other.

Finally, terminals formed along the short sides and terminals formed along the long sides were connected to an external power supply. In this way, an image display device including the image display member 10 (FIG. 1) in which a display region of 492×600 $mm^2$ was achieved by combining the three display sections 13 was completed.

It was confirmed that a desired good image could be obtained by the image display device thus completed by applying a desired electric current from the external power supply to the desired stripe-shaped first electrode and second electrode.

Example 2

Illumination Device

A simple matrix driving organic EL illumination device in which RGB sub-pixels are aligned in a short side direction of a panel was produced by the following procedure. A plastic substrate which had a thickness of 0.2 mm and a surface area of 500×220 $mm^2$ and which was coated with a silicon oxide having a thickness of 200 nm was used as the substrate 12 (FIG. 2).

On the surface of the plastic substrate 12, indium-tin oxide (ITO) was deposited by sputtering so that surface resistance became 10Ω/□. This formed a transparent electrode (anode) having a thickness of 300 nm which served as the first electrode 20.

Next, only a region of 492×216 $mm^2$ out of the surface having an area of 500×220 $mm^2$ was patterned by photolithography so that ITO remains. This formed the first electrode 20 (FIG. 11).

Next, $SiO_2$ was laminated by sputtering to a thickness of approximately 200 nm in order to form an edge cover in an edge portion of the first electrode 20. $SiO_2$ thus laminated was patterned by photolithography so that only the edge portion of the first electrode 20 is covered by $SiO_2$. In the present Example, only 10 μm portions from edges of four sides of the elongate first electrode 20 were covered by $SiO_2$.

Subsequently, the plastic substrate 12 was washed with water, and was then subjected to 10-minute pure water ultrasonic cleaning, 10-minute acetone ultrasonic cleaning, and 5-minute isopropyl alcohol steam cleaning in this order. Thereafter, the plastic substrate 12 was dried for 1 hour at 100° C.

The display section 13 formed on the 500×220 mm² substrate 12 was designed to have a size of 492×200 mm². A sealing area having a width of 2 mm was provided along upper, lower, left, and right edges of the display section 13. Further, a terminal draw-out region (a region in which the V scanner 15 is provided in FIG. 2) having a width of 2 mm was provided outside the sealing area so as to extend along one of short sides of the rectangular display section 13. Further, a terminal draw-out region (adjacent surface) having a width of 2 mm was provided, as a curved region (adjacent region), along one of long sides of the rectangular display section 13.

Next, the substrate 12, thus obtained through the above steps, on which the first electrode 20 was formed was fixed on a substrate holder in the in-line resistive heating deposition device illustrated in FIG. 12, and then pressure was reduced to vacuum of $1 \times 10^{-4}$ Pa or less. The present Example adopted a method of forming RGB light-emitting pixels by using color patterning utilizing a mask deposition method using a shadow mask 41.

Subsequently, the hole injection layer 31 (FIG. 11) having a thickness of 100 nm and the hole transport layer 32 (FIG. 11) having a thickness of 40 nm were formed in a manner identical to that of Example 1.

Next, a red organic light-emitting layer (thickness: 20 nm) was formed on a desired red light-emitting pixel formed on the hole transport layer 32 by mask color patterning using the shadow mask 41. A material, deposition speed, etc. for the red organic light-emitting layer are identical to those in the red organic light-emitting layer producing method described in Example 1.

Next, a green organic light-emitting layer (thickness: 20 nm) was formed in a manner identical to that of Example 1, and a blue organic light-emitting layer (thickness: 20 nm) was formed in a manner identical to that of Example 1.

Next, the hole blocking layer 34 (FIG. 4) (thickness: 10 nm), the electron transport layer 35 (thickness: 30 nm), and the electron injection layer 36 (thickness: 1 nm) were formed in a manner identical to that of Example 1.

Thereafter, the second electrode 21 (FIG. 11) was formed. First, the substrate 12 (on which the first electrode 20 and the organic layer 30 were formed) was fixed in a metal deposition chamber. Next, a shadow mask for formation of the second electrode (a mask having an opening so that the second electrode which has a size larger than the first electrode 20 by 2 mm can be formed so as to cover the entire first electrode 20) was aligned with the substrate 12 fixed in the metal deposition chamber. Then, aluminum was formed in a desired pattern on a surface of the electron injection layer 36 by a vacuum deposition method. This formed the second electrode 21 having a thickness of 200 nm.

Subsequently, an inorganic protective layer made of $SiO_2$ was formed to a thickness of 1 μm by sputtering in the sealing area, which is a 2 mm portion provided along the upper, lower, left and right edges of the display section 13, while being patterned with the use of a shadow mask, as in Example 1. On the inorganic protective layer, a parylene film having a thickness of 2 μm was formed by vapor deposition polymerization. The formation of $SiO_2$ and parylene was repeated five times. Thus, a laminated film of five layers was formed as a sealing film. In this way, the panel 11 illustrated in FIG. 2 was completed.

Next, after alignment using markers which served as the alignment members 16 provided outside the display section 13 along short sides, the three panels 11 thus produced were connected to each other so that long sides of the panels 11 are located side by side in a vertical direction as illustrated in (c) and (d) of FIG. 15.

Note that the adjacent region 12b provided along a long side was bent before the panels are connected to each other.

Finally, terminals formed along the short sides and terminals formed along the long sides were connected to an external power supply. In this way, an illumination device (organic EL illumination device) having a light-emitting region of 492×600 mm² obtained by combining the three display sections 13 was completed.

It was confirmed that desired good uniform white light emission could be obtained by applying a desired electric current from the external power supply to the electrodes of the organic EL illumination device thus completed.

Example 3

Active Driving Type Organic EL Image Display Device

First, an active matrix substrate in which RGB sub-pixels are aligned in a short side direction of a panel was produced by the following procedure. An inver substrate which had a thickness of 0.1 mm and a surface area of 750×220 mm² and which was coated with a silicon oxide having a thickness of 10 μm was used as the substrate 12 (FIG. 2).

An amorphous silicon semiconductor film was formed on a glass substrate by a PECVD method. Subsequently, the amorphous silicon semiconductor film was subjected to crystallizing treatment so that a polycrystalline silicon semiconductor film was formed. Next, the polycrystalline silicon semiconductor film was patterned into a plurality of islands by photolithography. Subsequently, a gate insulating film and a gate electrode layer were formed in this order on the polycrystalline silicon semiconductor layer thus patterned, and were then patterned by photolithography.

Then, the polycrystalline silicon semiconductor film thus patterned was doped with an impurity element such as phosphorus so that source and drain regions were formed. A TFT element was thus produced. Thereafter, a planarizing film was formed. The planarizing film was formed by laminating a silicon nitride film, which was formed by a PECVD method, and an acrylic resin layer, which was formed by a spin coater, in this order. First, after the silicon nitride film was formed, the silicon nitride film and the gate insulating film were collectively etched so that a contact hole which reaches the source and/or drain regions was formed. Then, a source wire was formed. Subsequently, the acrylic resin layer was formed, and a contact hole leading to the drain region was formed in an identical position to the contact hole in the drain region formed in the gate insulating film and the silicon nitride film. In this way, the active matrix substrate was completed. A function as a planarizing film is realized by the acrylic resin layer. Note that a capacitor for fixing a gate electric potential of the TFT to a constant electric potential is formed by providing an insulating film such as an interlayer insulating film between a drain of a switching TFT and a source of a driving TFT.

On the active matrix substrate, a contact hole which electrically connects the driving TFT to a first electrode of the red-light-emitting organic EL element, a contact hole which electrically connects the driving TFT to a first electrode of the green-light-emitting organic EL element, and a contact hole which electrically connects the driving TFT to a first electrode of the blue-light-emitting organic EL element are provided, each of which contact holes penetrates the planarizing layer.

Next, a first electrode (anode) of each pixel for electrical connection was formed by sputtering in the contact hole which penetrates the planarizing layer and which is connected to the TFT for driving each light-emitting pixel. The first electrode 20 (FIG. 11) was formed by laminating Al (aluminum) having a thickness of 150 nm and IZO (indium oxide-zinc oxide) having a thickness of 20 nm.

Next, the first electrode was patterned to a shape corresponding to each pixel by conventional photolithography. In the present Example, the first electrode was designed to have an area of 300 µm×100 µm. Further, the display section 13 (FIG. 11) formed on the substrate having an area of 750×220 mm$^2$ was 742×200 mm$^2$ in area, and a sealing area having a width of 2 mm was provided along upper, lower, left, and right edges of the display section. Further, a terminal draw-out region (a region in which the V scanner 15 is provided in FIG. 2) having a width of 2 mm was provided outside the sealing area so as to be along one of short sides of the rectangular display section 13. Further, a terminal draw-out section (adjacent surface) having a width of 2 mm was provided, as a curved region (adjacent region), along one of long sides of the rectangular display section 13.

Next, SiO$_2$ was laminated by sputtering to a thickness of approximately 200 nm in order to form an edge cover 28 in an edge portion of the first electrode 20. SiO$_2$ thus laminated was patterned by conventional photolithography so that only the edge portion of the first electrode 20 is covered by SiO$_2$. In the present Example, only 10 µm portions from edges of four sides of the elongate first electrode 20 were covered by SiO$_2$.

Next, the active substrate was cleaned. For example, the active substrate was subjected to ultrasonic cleaning using acetone or IPA for 10 minutes, and was then subjected to UV-ozone cleaning for 30 minutes.

Next, the substrate was fixed on a substrate holder in the in-line resistive heating deposition device illustrated in FIG. 12, and then pressure was reduced to vacuum of 1×10$^{-4}$ Pa or less. The present Example adopted a method of forming RGB light-emitting pixels by using color patterning utilizing a mask deposition method using a shadow mask 41.

Subsequently, the hole injection layer 31 (FIG. 11) made of 1,1-bis-di-4-tolylamino-phenyl-cyclohexane (TAPC) as a hole injection material was formed in a desired region by a resistive heating deposition method so as to have a thickness of 50 nm in a red light-emitting pixel part, a thickness of 150 nm in a green light-emitting pixel part, and a thickness of 100 nm a blue light-emitting pixel part by mask color patterning using a shadow mask.

Next, the hole transport layer 32 (FIG. 11) made of N,N'-di-1-naphthyl-N,N'-diphenyl-1,1'-biphenyl-1,1'-biphenyl-4,4'-diamine (NPD) as a hole transport material was formed by a resistive heating deposition method so as to have a thickness of 40 nm.

Next, the organic light-emitting layer 33 including a red organic light-emitting layer (thickness: 30 nm), a green organic light-emitting layer (thickness: 30 nm), and a blue organic light-emitting layer (thickness: 30 nm) was formed in a manner identical to that of Example 1.

Next, the hole blocking layer 34 (thickness: 10 nm) and the electron transport layer 35 (thickness: 30 nm) were formed in a manner identical to that of Example 1.

Thereafter, the second electrode 21 (FIG. 11) was formed. First, the substrate was fixed in a metal deposition chamber. Next, a shadow mask for formation of the second electrode (a mask having an opening so that the second electrode can be formed in a region that is larger, by 1 mm on each of upper, lower, left, and right edges, than the whole light-emitting region and a cathode contact area formed in advance on the substrate) was aligned with the substrate. Then, a magnesium-silver alloy (ratio 1:9) was formed on a surface of the electron transport layer 35 by a vacuum deposition method so as to have a thickness of 19 nm. This formed a semi-transparent second electrode 21 (FIG. 11).

Next, a protective layer 29 (FIG. 13) made of SiON was formed on the semi-transparent second electrode 21 by ion plating to a thickness of 100 nm while being patterned by a shadow mask. The protective layer 29 was formed under the following conditions. Plasma beam power: 4.0 kW, beam cross section area S1: 12.56 cm$^2$, beam energy density: 310 W/cm$^2$, introduction rate of N$_2$: 20 sccm, introduction rate of O$_2$: 10 sccm. Source material: SiON sintered body, density: relative density 99% or more.

Next, a sealing substrate in which a thermosetting resin for adhesion was applied in advance onto a polyimide film was bonded to the active substrate on which organic EL elements were formed. Then, the resin was cured by heating using a hot plate for 1 hour at 80° C. Note that the bonding step was performed under a dry air environment (moisture amount: −80° C.) for the purpose of preventing deterioration of an organic EL element caused by moisture.

Next, the polarizing plate was bonded to a surface of the substrate from which surface light was taken out. In this way, the panel 11 of the present Example was completed.

FIG. 13 is a cross-sectional view illustrating the panel 11 of the present Example. The panel 11 illustrated in FIG. 13 includes a gate metal 22, a gate insulating film 23, a wire 24, a TFT electrode 25, a planarizing film 26, a through hole 27, a thermosetting resin 37, a sealing substrate 38, and a polarizing plate 39.

Next, three rectangular active driving type organic EL panels thus produced were connected to each other with the use of a frame 18 (FIG. 16) for alignment so that long sides of the panels were located side by side in a vertical direction.

Note that the adjacent region 12b provided along a long side was bent before the panels were connected to each other.

Finally, terminals formed along short sides were connected to a power supply circuit via a source driver, and terminals formed along long sides were connected to an external power supply via a gate driver. In this way, an active driving type organic EL display (image display device) having a display surface of 742×600 mm$^2$ was completed.

It was confirmed that a desired good image could be obtained by the image display device thus completed by applying a desired electric current from the external power supply to each pixel.

The image display device of the present invention may be arranged such that the longitudinal direction is parallel with the row direction, the plurality of light-emitting elements included in each of the plurality of pixels are aligned in a direction parallel with the pair of short sides of the rectangular light-emitting section, the second terminal group is connected to the scan driving circuit, and the first terminal group is connected to the data driving circuit.

According to the arrangement, it is possible to reduce the number of scanning driving circuits to ⅓ of that of an image display device in which (i) a direction in which light-emitting elements in each pixel are aligned and a direction in which a scanning driving circuit and a data driving circuit are connected are identical to those of a conventional image display device and (ii) a plurality of panels are combined in a vertical direction.

The image display device of the present invention may be arranged such that the longitudinal direction is parallel with the column direction, the plurality of light-emitting elements included in each of the plurality of pixels are aligned in a direction parallel with the pair of long sides of the rectangular light-emitting section, the first terminal group is connected to the scan driving circuit, and the second terminal group is connected to the data driving circuit.

According to the arrangement, it is possible to reduce the number of scanning driving circuits to ⅓ of that of an image display device in which (i) a direction in which light-emitting elements in each pixel are aligned and a direction in which a scanning driving circuit and a data driving circuit are connected are identical to those of a conventional image display device and (ii) a plurality of panels are combined in a horizontal direction.

The first panel and the second panel may be connected to each other by linking (i) one of the edge portions of the flat surface of the base member of the first panel which one is adjacent to the adjacent surface and (ii) one of the edge portions of the flat surface of the base member of the second panel which one is opposite to the adjacent surface.

In addition to the above arrangement, the image display device of the present invention may be arranged such that each of the plurality of light-emitting elements is an organic electroluminescence element which has an organic layer including an organic light-emitting layer, the organic layer being provided between the first electrode and the second electrode, and the terminal group drawn out from the first electrode of the organic electroluminescence element being disposed in the adjacent surface so as to extend along the long side.

According to the arrangement, no terminal is provided within the flat surface in which the rectangular light-emitting section is provided. This eliminates visual unpleasantness caused by presence of a terminal between the light-emitting sections.

In addition to the above arrangement, the image display device of the present invention may be arranged such that one of the edge portions of the flat surface which one is opposite to an edge portion that is adjacent to the adjacent surface overlaps an end portion which extends along the other long side of the rectangular light-emitting section.

According to the arrangement, the edge portion of the flat surface of the base member is not observed outside the edge portion of the other long side when the rectangular light-emitting section is viewed from an opposite side.

This makes it possible to provide a single large light-emitting section with no gap by connecting panels.

In addition to the above arrangement, the image display device of the present invention may be arranged such that no sealing area is provided in the adjacent surface.

According to the arrangement, the adjacent surface can be curved or bent without any stress.

In the case of an organic EL element, adhesion between (i) a substrate part in which organic EL elements are formed and (ii) a sealing substrate is insufficient. Especially, adhesion between an organic layer and an electrode (generally, cathode) in an organic EL section is poor. Accordingly, in a case where the organic EL section is bent, there occurs a problem of detachment, especially detachment of the organic layer from the electrode in the organic EL section.

Meanwhile, according to the arrangement of the present invention, it is possible to more effectively form a curved or bent adjacent surface. Accordingly, it is possible to provide a large-sized organic EL display, organic EL display device, and organic EL illumination device, each of which has no seam and has excellent display quality, at lower cost.

In addition to the above arrangement, the image display device of the present invention may be arranged such that an alignment section for alignment between the base members of the plurality of panels to be linked is provided on the based members.

According to the arrangement, it is possible to prevent misalignment between organic electroluminescence elements from occurring in a connection section when a plurality of panels are bonded to each other.

If misalignment between organic electroluminescence elements (i.e., pixels) occurs in a connection section between the panels, a display image becomes defective. For example, assume that a 65-inch high-vision television is produced. In this case, each sub-pixel has a size of 210 μm×70 μm. Accordingly, in a case where panels are deviated from each other by 70 μm, misalignment between the sub-pixels occurs in a connection section. This causes a seam to be observed. Meanwhile, according to the arrangement of the present invention, since the alignment member is provided, it is possible to prevent such misalignment. As a result, a good image can be displayed on a display device.

The alignment member is preferably provided in a region different from the connection section. This is because the alignment member is observed as a seam after connection of panels in a case where the alignment member is provided in the connection section.

In addition to the above arrangement, the image display device of the present invention may be arranged such that the base member is a plate member. The base member is not limited to a plate member, and can be a flexible member.

It is preferable that the base member be made of metal or plastic.

According to the arrangement, it is possible to curve or bent the adjacent surface without any stress.

According to a conventional arrangement, since a panel is constituted by a glass substrate having a thickness of approximately 0.7 mm, it is impossible to bend the panel. Accordingly, even if a panel having a curved portion is produced as in the present invention, it becomes necessary to connect a flexible material, such as plastic, only in the curved portion of the panel. This causes an increase in cost and causes a defect in a connection section between panels. Meanwhile, according to the present invention, the base member is made of metal or plastic. Accordingly, the base member itself can be bent.

Consequently, since a substrate itself of a panel can be curved or bent, it is possible to provide a light-emitting panel device at lower cost. As a result, an image display device and an illumination device including this light-emitting panel can be reduced in cost.

The image display device of the present invention may be arranged such that the base member is an iron-nickel alloy having a linear expansion coefficient of $1 \times 10^{-5}/°C$. or less.

According to the arrangement, the substrate for an organic EL display is made of a metal having a similar thermal expansion coefficient to that of glass. Accordingly, a general TFT process can be used.

In addition to the above arrangement, the image display device of the present invention may be preferably arranged such that the image display section includes an active matrix driving element for driving the plurality of light-emitting elements, so that active matrix driving is carried out.

According to the arrangement, active matrix driving of each pixel is possible. In an active matrix driving organic EL display and an active matrix driving organic EL display device, a light emission time per frame can be made longer, and therefore light emission luminance per frame can be made lower, as compared with a simple matrix driving organic EL display and a simple matrix driving organic EL display device. Specifically, in a case where luminance of 100 cd/m² is obtained on a display (high-vision: resolution of 1920×1080), simple matrix driving requires instantaneous luminance of 108000 cd/m² (=100 cd/m²×1080), whereas active matrix driving only requires instantaneous luminance of 100 cd/m² (=100 cd/m²×1) since the whole time of each frame can be used as a light emission time. This allows for low voltage driving. Moreover, driving with high light emission efficiency can be achieved since light emission efficiency of an organic EL display generally declines as luminance increases. This allows a large decline in power consumption.

As a result, it is possible to provide a large-sized active matrix driving type image display device that is lower in power consumption and excellent in display quality.

In addition to the above arrangement, the image display device of the present invention may be arranged such that the first electrode and the second electrode are linear electrodes which cross at right angles and which extend parallel with the flat surface, so that simple matrix driving is carried out.

In addition to the above arrangement, the image display device of the present invention may be preferably arranged such that each of the plurality of light-emitting elements provided in the image display section is an organic electroluminescence element which has an organic layer including an organic light-emitting layer, the organic layer being provided between the first electrode and the second electrode, a power supply wire for supplying power to the image display section is connected to the second electrode, and a terminal of the power supply wire is disposed on the flat surface along one of the pair of short sides of the rectangular light-emitting section which is the image display section.

According to the arrangement, since the organic electroluminescence elements are driven by an electric current, an electric current is required for light emission of the organic electroluminescence elements. It is known that a conventional display (display device) having a long electric current supply wire has a problem that a resistive component in the electric current supply wire causes, as a result of passage of an electric current, a decline in voltage, which leads to a rise in power consumption, and heat generation. In view of this, according to the arrangement of the present invention, a terminal of an electric current supply wire connected to a second electrode of a light-emitting section of a panel is disposed on a flat surface of the panel. Accordingly, the electric current supply wire can have a short length. This is very meaningful for solution of the aforementioned problem. Especially in a large-sized high-resolution display (display device), an increase in pixel area resulting from an increase in the number of pixels and an increase in display region of the display (display device) makes it necessary to supply larger amounts of electric current through the electric current supply wire. Accordingly, the aforementioned problem becomes more severe. According to the present invention, it is possible to solve the problems caused by passing an electric current through the electric current supply wire. This allows for a large decline in power consumption and a large decline in heat generation.

As a result, it is possible to produce a large-sized light-emitting panel device with lower power consumption and less heat generation. Accordingly, use of this light-emitting panel device makes it possible to produce a large-sized display device that is excellent in display quality.

Industrial Applicability

The present invention is most suitably applicable as an image display device, and is applicable also as an illumination device. The present invention therefore has wide industrial applicability.

REFERENCE SIGNS LIST

2: Switching TFT
3: Driving TFT
10: Image display member (image display device)
11: Panel
12: Substrate (base member)
12a: Formation region
12a': Flat surface
12b: Adjacent region
12b': Adjacent surface
13: Display section (light-emitting section)
14: H scanner
15: V scanner
17a: Optical adjustment substrate
17b: Optical adjustment substrate
20: First electrode
21: Second electrode
22: Gate metal
23: Gate insulating film
24: Wire
25: TFT electrode
26: Planarizing film
27: Through hole
28: Edge cover
29: Protective layer
30: Organic layer
31: Hole injection layer
32: Hole transport layer
33: Organic light-emitting layer
34: Hole blocking layer
35: Electron transport layer
36: Electron injection layer
37: Thermosetting resin
38: Sealing substrate
39: Polarizing plate
40: Deposition source
41: Shadow mask
50: Pixel
51R, 51G, 51B: Sub-pixel
54: Data signal line
55: Power supply line
56: Scanning signal line
57: Gate driver (scanning driving circuit)
58: Source driver (data driving circuit)
59: Power supply circuit
61: Shift register
62: Sampling latch
63: Digital-analog converter

The invention claimed is:

1. An image display device comprising a plurality of panels,
the plurality of panels each including:
a rectangular light-emitting section in which a plurality of pixels each including a plurality of light-emitting elements are provided, the plurality of light-emitting elements having a first electrode and a second electrode and emitting light as a result of electric current supply or voltage application;
a base member having a flat surface on which the rectangular light-emitting section is provided and an adjacent surface that is adjacent to one of edge portions of the flat surface which extend along a pair of long sides of the rectangular light-emitting section, the base member being curved or bent in the adjacent surface in a direction in which the flat surface is warped outwards;

a first terminal group drawn out from the first electrode of the rectangular light-emitting section, the first terminal group being formed in the adjacent surface; and a second terminal group drawn out from the second electrode of the plurality of light-emitting elements, the second terminal group being formed on the flat surface along one of a pair of short sides of the rectangular light-emitting section, the plurality of panels including a first panel and a second panel that is different from the first panel, the first panel and the second panel being connected to each other by linking one of the edge portions of the flat surface of the first panel and one of the edge portions of the flat surface of the second panel so that (i) the light-emitting section of the first panel and the light-emitting section of the second panel are disposed in a same direction and (ii) a longitudinal direction of the light-emitting section of the first panel is parallel to that of the light-emitting section of the second panel, the light-emitting sections of the plurality of panels being combined to constitute an image display section in which the plurality of pixels are arranged in a matrix, the plurality of light-emitting elements included in each of the plurality of pixels being aligned in a column direction of the matrix, the image display device further comprising:

a scan driving circuit connected to one of the first terminal group and the second terminal group which one is drawn out in a row direction of the matrix, the scan driving circuit outputting a scanning signal which sets the plurality of light-emitting elements to a selection state; and a data driving circuit connected to one of the first terminal group and the second terminal group which one is drawn out in the column direction of the matrix, the data driving circuit supplying a data signal to the plurality of light-emitting elements set to the selection state by the scanning signal.

2. The image display device according to claim 1, wherein:
the longitudinal direction is parallel with the row direction,
the plurality of light-emitting elements included in each of the plurality of pixels are aligned in a direction parallel with the pair of short sides of the rectangular light-emitting section,
the second terminal group is connected to the scan driving circuit, and
the first terminal group is connected to the data driving circuit.

3. The image display device according to claim 1, wherein:
the longitudinal direction is parallel with the column direction,
the plurality of light-emitting elements included in each of the plurality of pixels are aligned in a direction parallel with the pair of long sides of the rectangular light-emitting section,
the first terminal group is connected to the scan driving circuit, and
the second terminal group is connected to the data driving circuit.

4. The image display device according to claim 1, wherein the first panel and the second panel are connected to each other by linking (i) one of the edge portions of the flat surface of the base member of the first panel which one is adjacent to the adjacent surface and (ii) one of the edge portions of the flat surface of the base member of the second panel which one is opposite to the adjacent surface.

5. The image display device according to claim 1, wherein:
each of the plurality of light-emitting elements is an organic electroluminescence element which has an organic layer including an organic light-emitting layer, the organic layer being provided between the first electrode and the second electrode, and
the terminal group drawn out from the first electrode of the organic electroluminescence element being disposed in the adjacent surface so as to extend along the long side.

6. The image display device according to claim 1, wherein one of the edge portions of the flat surface which one is opposite to an edge portion that is adjacent to the adjacent surface overlaps an end portion which extends along the other long side of the rectangular light-emitting section.

7. The image display device according to claim 1, wherein no sealing area is provided in the adjacent surface.

8. The image display device according to claim 1, wherein an alignment section for alignment between the base members of the plurality of panels to be linked is provided on the based members.

9. The image display device according to claim 1, wherein the base member is a plate member.

10. The image display device according to claim 1, wherein the base member is a flexible member.

11. The image display device according to claim 1, wherein the base member is made of metal or plastic.

12. The image display device according to claim 1, wherein the base member is an iron-nickel alloy having a linear expansion coefficient of $1 \times 10^{-5}/°$ C. or less.

13. The image display device according to claim 1, wherein the image display section includes an active matrix driving element for driving the plurality of light-emitting elements, so that active matrix driving is carried out.

14. The image display device according to claim 1, wherein the first electrode and the second electrode are linear electrodes which cross at right angles and which extend parallel with the flat surface, so that simple matrix driving is carried out.

15. The image display device according to claim 1, wherein:
each of the plurality of light-emitting elements provided in the image display section is an organic electroluminescence element which has an organic layer including an organic light-emitting layer, the organic layer being provided between the first electrode and the second electrode,
a power supply wire for supplying power to the image display section is connected to the second electrode, and
a terminal of the power supply wire is disposed on the flat surface along one of the pair of short sides of the rectangular light-emitting section which is the image display section.

16. A method for manufacturing the image display device of claim 1, the method comprising, for each of the first panel and the second panel:
(a) preparing the base member having the flat surface and the adjacent surface; and
(b) forming organic electroluminescence elements on the flat surface of the base member prepared in the step (a), the organic electroluminescence elements being the light-emitting elements having the first electrode and the second electrode and emitting light as a result of electric current supply or voltage application, the step (b) including the steps of:

(c) forming the first electrode or the second electrode on the flat surface of the base member; and (d) forming, by an in-line deposition process, the organic layer on the electrode formed in the step (c), the organic layer being provided between the first electrode and the second electrode in the organic electroluminescence elements.

17. An image display device comprising a plurality of panels, the plurality of panels each including:

a rectangular light-emitting section in which a plurality of pixels each including a plurality of light-emitting elements are provided, the plurality of light-emitting elements having a first electrode and a second electrode and emitting light as a result of electric current supply or voltage application;

a base member having a flat surface on which the rectangular light-emitting section is provided and an adjacent surface that is adjacent to one of edge portions of the flat surface which extend along a pair of long sides of the rectangular light-emitting section, the base member being curved or bent in the adjacent surface in a direction in which the flat surface is warped outwards;

a first terminal group drawn out from the first electrode of the rectangular light-emitting section, the first terminal group being formed in the adjacent surface; and a second terminal group drawn out from the second electrode of the plurality of light-emitting elements, the second terminal group being formed on the flat surface along one of a pair of short sides of the rectangular light-emitting section, the plurality of panels including a first panel and a second panel that is different from the first panel, the first panel and the second panel being connected to each other by linking one of the edge portions of the flat surface of the first panel and one of the edge portions of the flat surface of the second panel so that (i) the light-emitting section of the first panel and the light-emitting section of the second panel are disposed in a same direction and (ii) a longitudinal direction of the light-emitting section of the first panel is parallel to that of the light-emitting section of the second panel, the light-emitting sections of the plurality of panels being combined to constitute an image display section in which the plurality of pixels are arranged in a matrix, the longitudinal direction being parallel with a row direction of the matrix, the plurality of light-emitting elements included in each of the plurality of pixels being aligned in the row direction or a column direction of the matrix, the image display device further comprising:

a scan driving circuit connected to the first terminal group, the scan driving circuit outputting a scanning signal which sets the plurality of light-emitting elements to a selection state; and a data driving circuit connected to the second terminal group, the data driving circuit supplying a data signal to the plurality of light-emitting elements set to the selection state by the scanning signal.

18. A panel comprising:

a rectangular light-emitting section in which a plurality of pixels each including a plurality of light-emitting elements are provided, the plurality of light-emitting elements having a first electrode and a second electrode and emitting light as a result of electric current supply or voltage application;

a base member having a flat surface on which the rectangular light-emitting section is provided and an adjacent surface that is adjacent to one of edge portions of the flat surface which extend along a pair of long sides of the rectangular light-emitting section, the base member being curved or bent in the adjacent surface in a direction in which the flat surface is warped outwards; and a terminal group drawn out from the first electrode of the rectangular light-emitting section, the terminal group being formed in the adjacent surface, the plurality of light-emitting elements included in each of the plurality of pixels being aligned in a direction parallel with the pair of short sides of the rectangular light-emitting section.

* * * * *